(12) United States Patent
Yoshimura et al.

(10) Patent No.: US 11,523,070 B2
(45) Date of Patent: Dec. 6, 2022

(54) SOLID-STATE IMAGING ELEMENT, IMAGING DEVICE, AND METHOD FOR CONTROLLING SOLID-STATE IMAGING ELEMENT

(71) Applicant: SONY SEMICONDUCTOR SOLUTIONS CORPORATION, Atsugi (JP)

(72) Inventors: Hisao Yoshimura, Atsugi (JP); Ryoji Suzuki, Atsugi (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 20 days.

(21) Appl. No.: 17/250,371

(22) PCT Filed: May 17, 2019

(86) PCT No.: PCT/JP2019/019654
§ 371 (c)(1),
(2) Date: Jan. 12, 2021

(87) PCT Pub. No.: WO2020/021826
PCT Pub. Date: Jan. 30, 2020

(65) Prior Publication Data
US 2021/0352228 A1    Nov. 11, 2021

(30) Foreign Application Priority Data
Jul. 23, 2018 (JP) .............................. JP2018-137345

(51) Int. Cl.
*H04N 5/341* (2011.01)
*H04N 5/353* (2011.01)
*H01L 27/146* (2006.01)

(52) U.S. Cl.
CPC ....... *H04N 5/341* (2013.01); *H01L 27/14621* (2013.01); *H01L 27/14627* (2013.01); *H01L 27/14645* (2013.01); *H04N 5/353* (2013.01)

(58) Field of Classification Search
CPC .... H04N 5/341; H04N 5/353; H04N 5/36961; H04N 5/37457; H01L 27/14621;
(Continued)

(56) References Cited

U.S. PATENT DOCUMENTS

| 9,030,589 B2 | 5/2015 | Sasaki et al. |
| 2009/0290059 A1 | 11/2009 | Suzuki |

(Continued)

FOREIGN PATENT DOCUMENTS

| JP | 2008-193527 A | 8/2008 |
| JP | 2012-049201 A | 3/2012 |

(Continued)

OTHER PUBLICATIONS

International Search Report and Written Opinion of PCT Application No. PCT/JP2019/019654, dated Jul. 23, 2019, 10 pages of ISRWO.

*Primary Examiner* — Abdelaaziz Tissire
(74) *Attorney, Agent, or Firm* — Chip Law Group

(57) ABSTRACT

Color mixing between pixels is prevented in a solid-state imaging element in which a pair of pixels for detecting the phase difference of a pair of light rays are arranged. A pair of photoelectric conversion elements receive a pair of light rays made by pupil-splitting. A floating diffusion layer generates a pair of pixel signals from electric charge transferred from each of the pair of photoelectric conversion elements. A pair of transfer transistors transfer the electric charge from the pair of photoelectric conversion elements to the floating diffusion layer. In a case of detecting the phase difference of the pair of light rays from the pair of pixel (Continued)

signals, the control unit takes control so that back gate voltages that include the back gate potentials of both of the pair of transfer transistors with respect to the potential barrier between the pair of photoelectric conversion elements have values different from values in a case of synthesizing the pair of pixel signals.

7 Claims, 23 Drawing Sheets

(58) Field of Classification Search
CPC ......... H01L 27/14627; H01L 27/14645; H01L 27/14612
See application file for complete search history.

(56) References Cited

U.S. PATENT DOCUMENTS

| | | | |
|---|---|---|---|
| 2011/0019049 A1* | 1/2011 | Jin | H04N 5/378 257/292 |
| 2013/0182158 A1* | 7/2013 | Kobayashi | H01L 27/14627 257/292 |
| 2016/0099268 A1* | 4/2016 | Minowa | H01L 27/1463 257/432 |
| 2017/0126997 A1* | 5/2017 | Ha | H04N 5/3591 |
| 2017/0142325 A1* | 5/2017 | Shimokawa | H04N 5/347 |
| 2018/0190709 A1* | 7/2018 | Lee | H01L 31/02019 |

FOREIGN PATENT DOCUMENTS

| | | |
|---|---|---|
| JP | 2013-041890 A | 2/2013 |
| WO | 2008/096799 A1 | 8/2008 |
| WO | 2013/022111 A1 | 2/2013 |
| WO | 2017/086673 A1 | 5/2017 |

* cited by examiner

SOLID-STATE IMAGING ELEMENT, IMAGING DEVICE, AND METHOD FOR CONTROLLING SOLID-STATE IMAGING ELEMENT

CROSS REFERENCE TO RELATED APPLICATIONS

This application is a U.S. National Phase of International Patent Application No. PCT/JP2019/019654 filed on May 17, 2019, which claims priority benefit of Japanese Patent Application No. JP 2018-137345 filed in the Japan Patent Office on Jul. 23, 2018. Each of the above-referenced applications is hereby incorporated herein by reference in its entirety.

TECHNICAL FIELD

The present technology relates to a solid-state imaging element, an imaging device, and a method for controlling a solid-state imaging element. To be more specific, the present invention relates to a solid-state imaging element and an imaging device for detecting a phase difference between a pair of light rays, and a method for controlling the solid-state imaging element.

BACKGROUND ART

Conventionally, a phase difference AF (Auto Focus) method for detecting the phase difference of a pair of pupil-split light rays has been used in imaging devices for the purpose of determining the focusing position of the lens. For example, a solid-state imaging element in which a pair of pixels that receive a pair of pupil-split light rays are arranged on an image surface has been proposed (see, for example, PTL 1).

CITATION LIST

Patent Literature

[PTL 1]
Japanese Patent Laid-open No. 2013-41890

SUMMARY

Technical Problems

In the above-mentioned conventional technique, a phase difference is detected from each pixel signal of a pair of pixels, and thereby the focusing position of the lens can be obtained from the phase difference. However, when the amount of light is large, there is a problem that electric charge overflows in one of the pair of pixels and moves to the other, resulting in color mixing. Due to this color mixing, the accuracy of detecting the phase difference is lowered.

The present technology has been created in view of such a situation, and an object is to prevent color mixing between pixels in a solid-state imaging element in which a pair of pixels for detecting a phase difference of a pair of light rays are arranged.

Solution to Problems

The present technology is made to solve the above-mentioned problems, and the first aspect thereof is a solid-state imaging element including, a pair of photoelectric conversion elements that receive a pair of light rays made by pupil-splitting, a floating diffusion layer that generates a pair of pixel signals from electric charge transferred from each of the pair of photoelectric conversion elements, a pair of transfer transistors that transfer the electric charge from the pair of photoelectric conversion elements to the floating diffusion layer, and a control unit that takes control such that back gate voltages that include the back gate potentials of both of the pair of transfer transistors with respect to the potential barrier between the pair of photoelectric conversion elements have values different from values in a case of synthesizing the pair of pixel signals, in a case of detecting the phase difference of the pair of light rays from the pair of pixel signals, and a method for controlling the solid-state imaging element. This brings about an effect of control so that the back gate voltages of both of the pair of transfer transistors at the time of focusing are set to different values from those at the time of imaging.

Further, in the first aspect, a reset transistor for initializing the amount of the electric charge in the floating diffusion layer may be further provided, and the control unit may control the back gate voltages by controlling the drain potential of the reset transistor. This brings about an effect of control so that the back gate voltages of both of the pair of transfer transistors at the time of focusing are set to different values from those at the time of imaging by controlling the drain potential.

Further, in the first aspect, a reset drain drive wiring for connecting the drain of the reset transistor and the control unit may be provided to allow the control unit to control the drain potential via the reset drain drive wiring. This brings about the effect of controlling the drain potential by the control unit via the reset drain drive wiring.

Further, in the first aspect, the control unit may control the back gate voltages by controlling the gate potentials of both of the pair of transfer transistors. This brings about an effect of control so that the back gate voltages of both of the pair of transfer transistors at the time of focusing are set to values different from those at the time of imaging by controlling the gate potential.

Further, in the first aspect, the electric charge includes an electron, and the control unit may take control so as to set the back gate voltages to higher voltages in the case of detecting the phase difference than in the case of synthesizing the pair of pixel signals. This brings about an effect of control so that the back gate voltages of both of the pair of transfer transistors at the time of focusing are set to different values from those at the time of imaging when electrons are transferred.

Further, in the first aspect, the control unit may control the back gate voltages after the start of exposure of the pair of photoelectric conversion elements in the case of synthesizing the pair of pixel signals. This bring about the effect of controlling the back gate voltages after the start of exposure.

Further, in the first aspect, an on-chip lens that collects a light ray and a color filter that allows a light ray having a wavelength within a predetermined wavelength range and coming from the on-chip lens to pass through the color filter are further provided, and the pair of photoelectric conversion elements may receive the light ray that has passed through the color filter. This brings about an effect of capturing a color image.

Further, the second aspect of this technology is an imaging device including a pair of photoelectric conversion elements that receive a pair of light rays made by pupil-splitting, a floating diffusion layer that generates a pair of pixel signals from the electric charge transferred from each of the pair of photoelectric conversion elements, a pair of transfer transistors that transfer the electric charge from the pair of photoelectric conversion elements to the floating diffusion layer, a control unit that takes control such that back gate voltages that include the back gate potentials of both of the pair of transfer transistors with respect to the potential barrier between the pair of photoelectric conversion elements have values different from values in the case of synthesizing the pair of pixel signal, in the case of detecting the phase difference of the pair of light rays from the pair of pixel signals, and a processing unit that performs a process of synthesizing the pair of pixel signals. This brings about an effect of control so that the back gate voltages of both of the pair of transfer transistors at the time of focusing are set to different values from those at the time of imaging, and the image data is captured.

Advantageous Effect of Invention

According to the present technology, in a solid-state imaging element in which a pair of pixels for detecting a phase difference of a pair of light rays are arranged, an excellent effect can be obtained so that color mixing between the pixels can be prevented. Incidentally, the effects are not necessarily limited to those described herein, and may be any of the effects described in the present disclosure.

DESCRIPTION OF EMBODIMENTS

Hereinafter, modes for carrying out the present technology (hereinafter referred to as embodiments) will be described. The description will be given in the following order.

1. First embodiment (example of controlling transfer back gate voltages)
2. Second embodiment (example of controlling the transfer back gate voltages by controlling the gate potential)
3. Third embodiment (example of application to a mobile body)

1. First Embodiment

Configuration Example of Imaging Device

Figure 1:
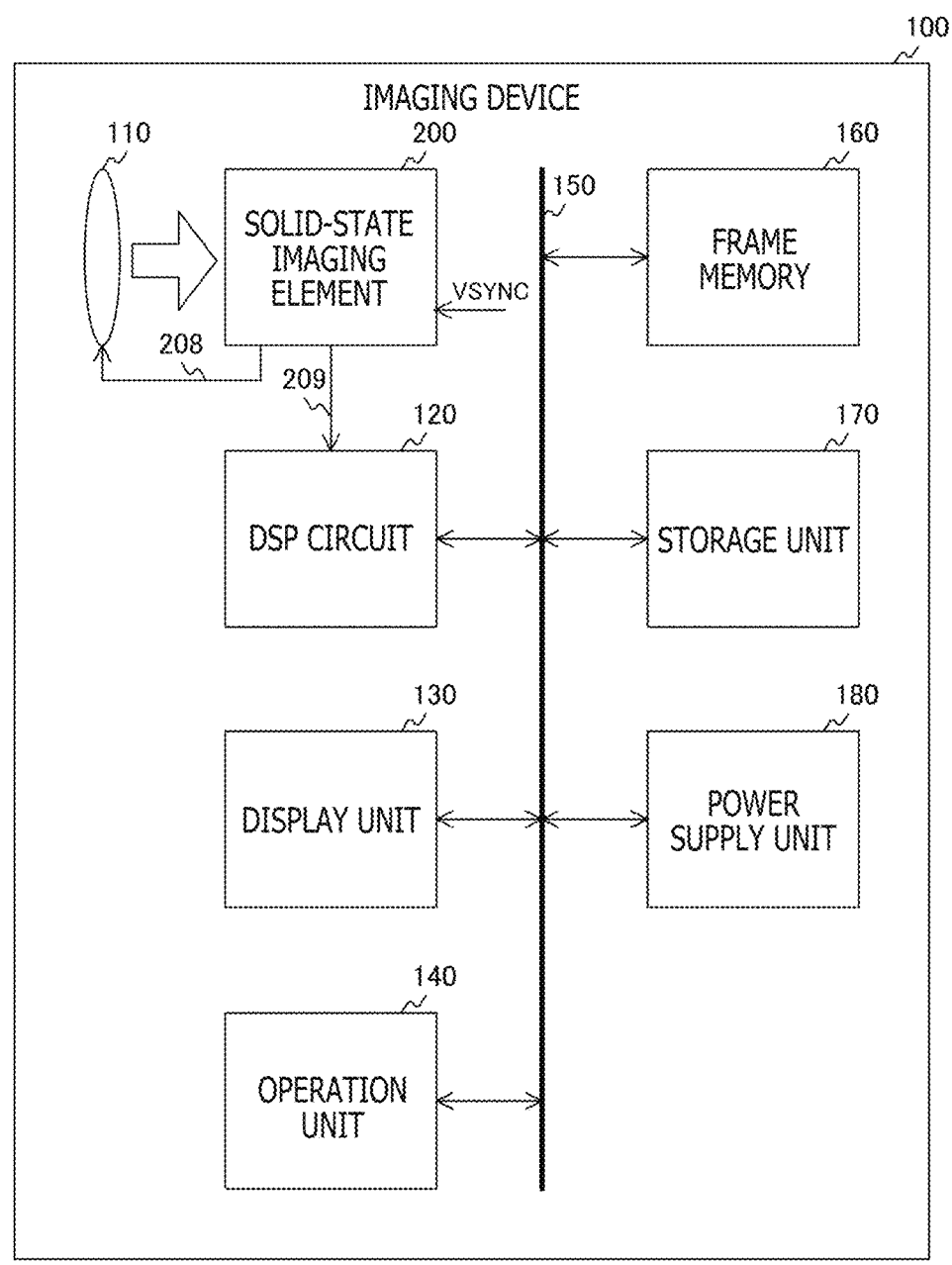
FIG. 1 is a block diagram illustrating a configuration example of an imaging device according to a first embodiment of the present technology.

FIG. 1 is a block diagram illustrating a configuration example of an imaging device 100 according to the first embodiment of the present technology. The imaging device 100 is a device for capturing image data, and includes an optical unit 110, a solid-state imaging element 200, and a DSP (Digital Signal Processing) circuit 120. Further, the imaging device 100 includes a display unit 130, an operation unit 140, a bus 150, a frame memory 160, a storage unit 170, and a power supply unit 180. As the imaging device 100, for example, in addition to a digital camera such as a digital still camera, a smartphone, a personal computer, an in-vehicle camera, or the like having an imaging function is assumed.

The optical unit 110 collects light from the subject and guides the light to the solid-state imaging element 200. The optical unit 110 is provided with a plurality of lenses including a focus lens. The position of the focus lens is controlled by a driving signal from the solid-state imaging element 200.

The solid-state imaging element 200 generates image data by photoelectric conversion in synchronization with a vertical synchronization signal VSYNC. Here, the vertical synchronization signal VSYNC is a periodic signal having a predetermined frequency indicating the timing of imaging. The solid-state imaging element 200 supplies the generated image data to the DSP circuit 120 via a signal line 209. Further, the solid-state imaging element 200 supplies a driving signal to the optical unit 110 via a signal line 208.

The DSP circuit 120 executes predetermined signal processing on the image data from the solid-state imaging element 200. The DSP circuit 120 outputs the processed image data to the frame memory 160 or the like via the bus 150.

The display unit 130 displays image data. As the display unit 130, for example, a liquid crystal panel or an organic EL (Electro Luminescence) panel is assumed. The operation unit 140 generates an operation signal in accordance with the operation of the user.

The bus 150 is a common route for the optical unit 110, the solid-state imaging element 200, the DSP circuit 120, the display unit 130, the operation unit 140, the frame memory 160, the storage unit 170, and the power supply unit 180 to exchange data with each other.

The frame memory 160 holds image data. The storage unit 170 stores various kinds of data such as image data. The power supply unit 180 supplies power to the solid-state imaging element 200, the DSP circuit 120, the display unit 130, and the like.

Configuration Example of Solid-State Imaging Element

Figure 2:
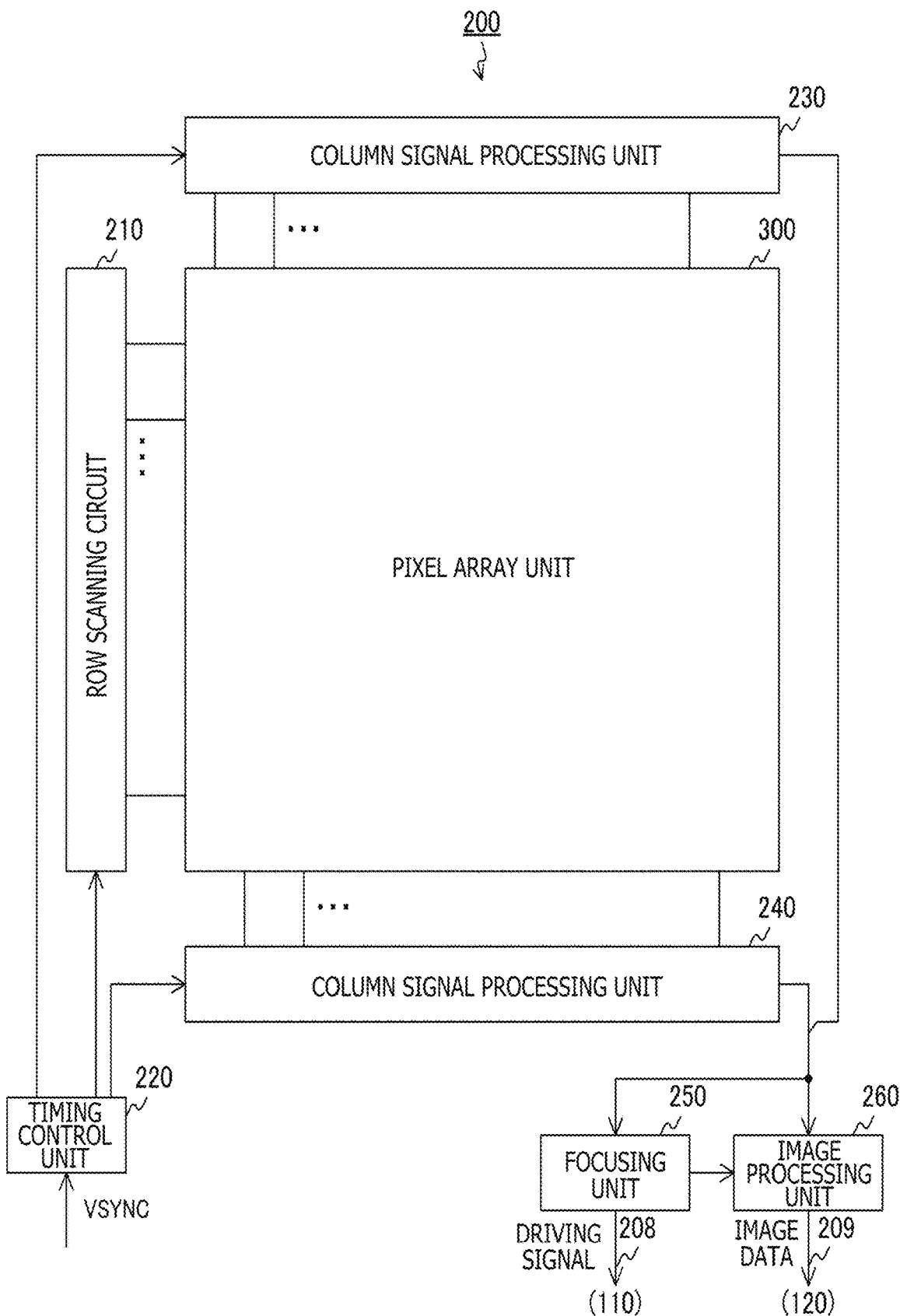
FIG. 2 is a block diagram illustrating a configuration example of a solid-state imaging element according to the first embodiment of the present technology.

FIG. 2 is a block diagram illustrating a configuration example of the solid-state imaging element 200 according to the first embodiment of the present technology. The solid-state imaging element 200 includes a row scanning circuit 210, a timing control unit 220, and a pixel array unit 300. Further, the solid-state imaging element 200 includes column signal processing units 230 and 240, a focusing unit 250, and an image processing unit 260. A plurality of pixels is arranged in a two-dimensional lattice shape in the pixel array unit 300.

The row scanning circuit 210 drives each of the rows in the pixel array unit 300 in turn to output an analog pixel signal. Pixels in a certain row output pixel signals to the column signal processing unit 230, and pixels in another row different from the row output pixel signals to the column signal processing unit 240.

The timing control unit 220 controls the operation timing of the row scanning circuit 210 and the column signal processing units 230 and 240 in synchronization with the vertical synchronization signal VSYNC.

The column signal processing unit 230 executes signal processing such as AD (Analog-to-Digital) conversion processing and CDS (Correlated Double Sampling) processing on the pixel signals from the rows. The column signal processing unit 240 executes signal processing on pixel signals from a row different from that of the column signal processing unit 230. The column signal processing units 230 and 240 supply the processed pixel signal to the focusing unit 250 and the image processing unit 260. By arranging both the column signal processing units 230 and 240, read-out can be performed in two rows at the same time. Incidentally, only one of the column signal processing units 230 and 240 may be arranged.

The focusing unit 250 detects the phase difference between the pair of pupil-split light rays and obtains the focusing position of the focus lens. The focusing unit 250 generates a driving signal for driving the focus lens to move to the obtained focusing position, and supplies the driving signal to the optical unit 110 via the signal line 208. Further, when the focus lens is driven, the focusing unit 250 generates a focusing flag indicating that focusing is completed, and supplies the focusing flag to the image processing unit 260.

The image processing unit 260 generates image data after the end of focusing and performs predetermined image processing. The image processing unit 260 supplies the processed image data to the DSP circuit 120 via the signal line 209.

Configuration Example of Pixel Array Unit

Figure 3:
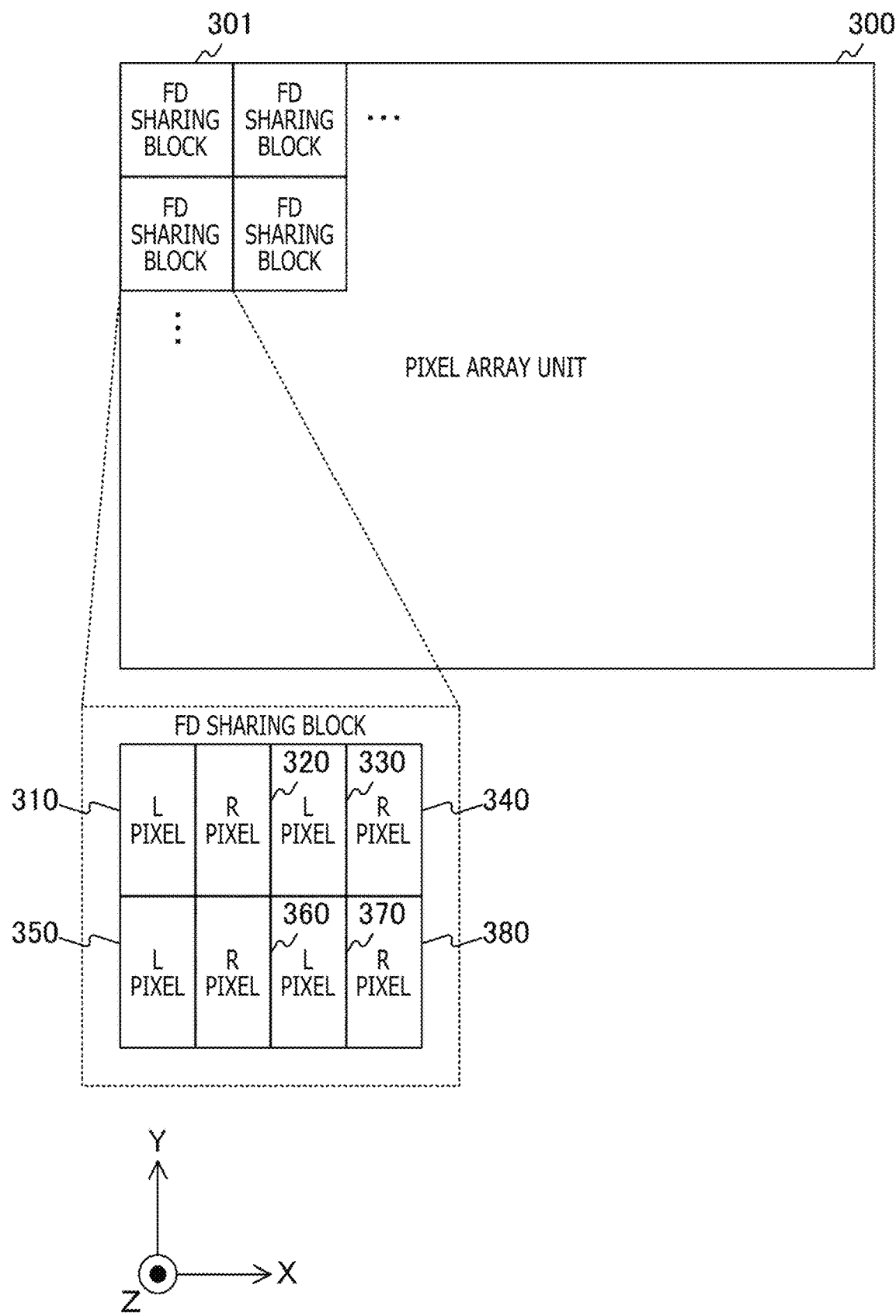
FIG. 3 is an example of the plan view of a pixel array unit according to the first embodiment of the present technology.

FIG. 3 is an example of the plan view of the pixel array unit 300 according to the first embodiment of the present technology. A plurality of FD sharing blocks 301 is arranged in a two-dimensional lattice shape in the pixel array unit 300. A plurality of pairs of pixels sharing the floating diffusion layer is arranged in the FD sharing block 301. For example, in the FD sharing block 301, four pairs of pixels, which are a pair of L (Left) pixel 310 and R (Right) pixel 320, a pair of L pixel 330 and R pixel 340, a pair of L pixel 350 and R pixel 360, and a pair of L pixel 370 and R pixel 380, are provided. The L pixel and the R pixel (such as the L pixel 310 and the R pixel 320) forming the pair receive the pair of pupil-split light rays. These eight pixels share one floating diffusion layer.

Hereinafter, the direction parallel to the row is referred to as "X direction," and the direction parallel to the column is referred to as "Y direction." Further, the direction perpendicular to the X direction and the Y direction is referred to as the "Z direction."

Configuration Example of FD Sharing Block

Figure 4:
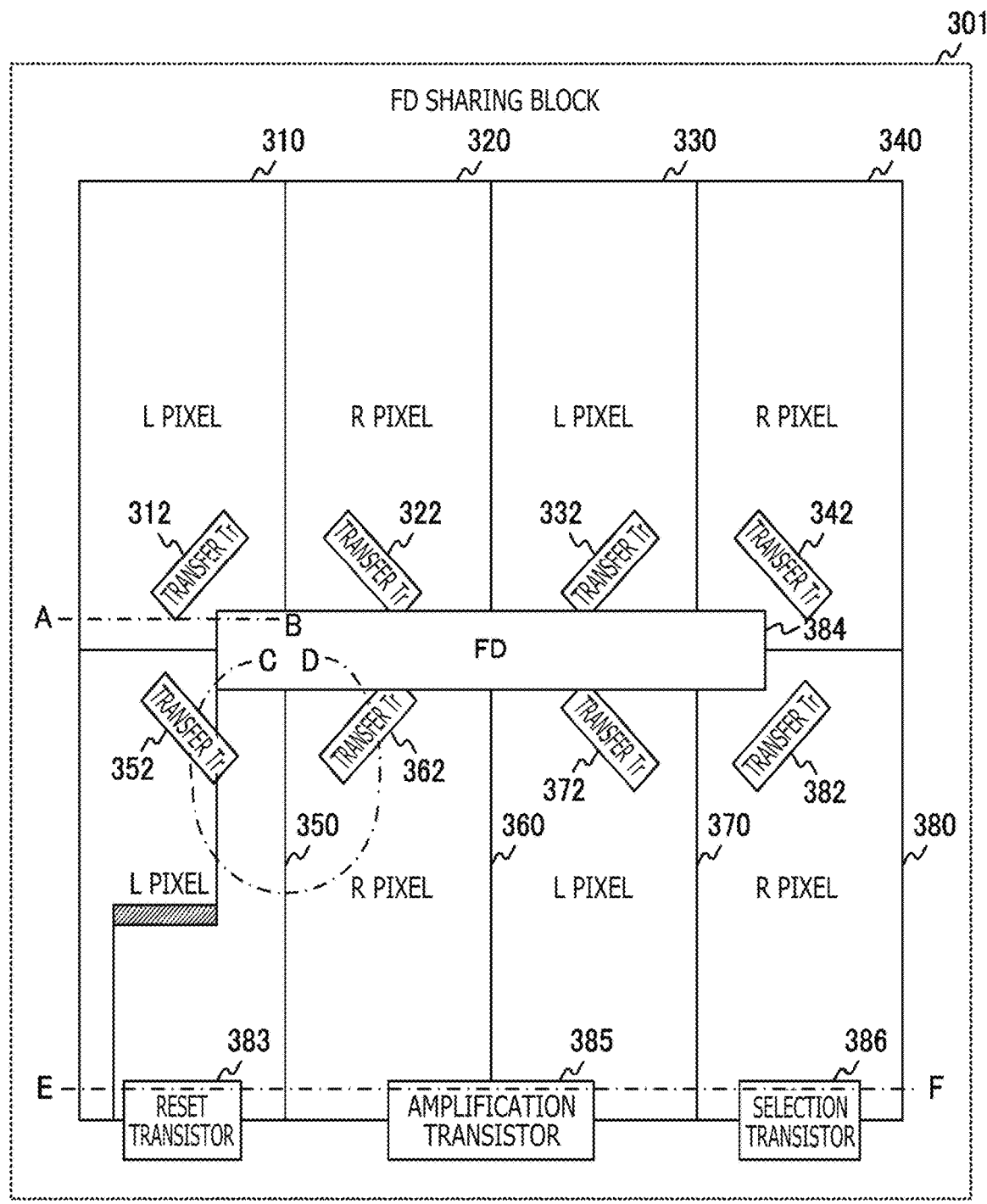
FIG. 4 is an example of the plan view of an FD (Floating Diffusion) sharing block according to the first embodiment of the present technology.

FIG. 4 is an example of a plan view of the FD sharing block 301 according to the first embodiment of the present technology. A floating diffusion layer 384 is disposed at the center of the FD sharing block 301. Further, transfer transistors 312, 332, 352, 372, 322, 342, 362, and 382 are arranged on the L pixels 310, 330, 350, and 370 and the R pixels 320, 340, 360, and 380.

Further, a reset transistor 383, an amplification transistor 385, and a selection transistor 386 are arranged below the FD sharing block 301 with the predetermined direction in the Y direction as the upward direction. It should be noted that a photoelectric conversion element is further arranged in each of the pixels but is omitted in the figure for convenience of description.

Figure 5:
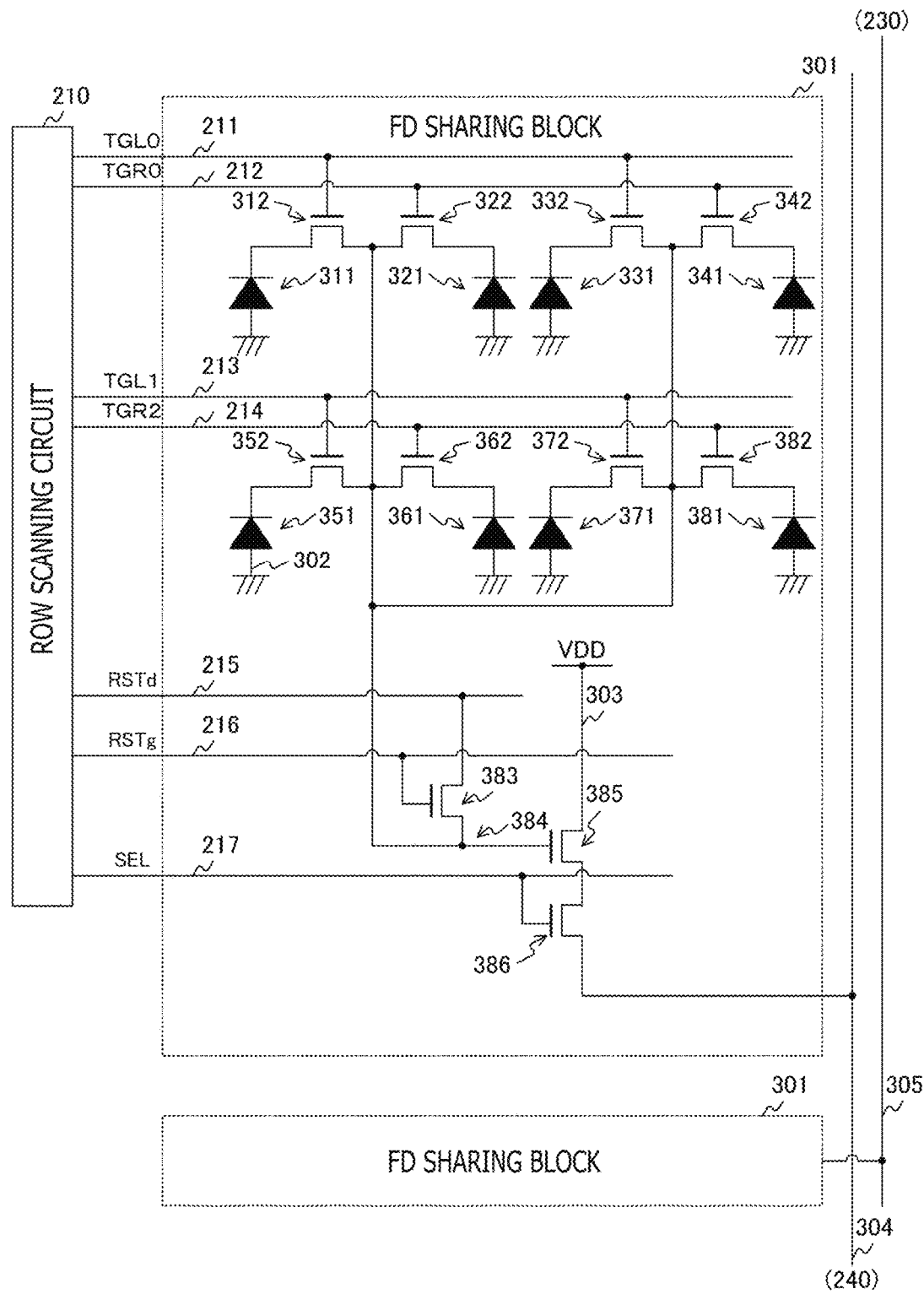
FIG. 5 is a circuit diagram illustrating a configuration example of the FD sharing block according to the first embodiment of the present technology.

FIG. 5 is a circuit diagram illustrating a configuration example of the FD sharing block 301 according to the first embodiment of the present technology. The FD sharing block 301 includes photoelectric conversion elements 311, 321, 331, 341, 351, 361, 371, and 381, and the transfer transistors 312, 322, 332, 342, 352, 362, 372, and 382. Further, the FD sharing block 301 includes the reset transistor 383, the floating diffusion layer 384, the amplification transistor 385, and the selection transistor 386.

The anodes of the photoelectric conversion elements 311, 321, 331, 341, 351, 361, 371, and 381 are connected to the ground terminal via a ground line 302.

A transfer signal TGL0 from the row scanning circuit 210 is input to the gates of the transfer transistors 312 and 332 via a transfer gate drive wiring 211. The transfer signal TGR0 from the row scanning circuit 210 is input to the gates of the transfer transistors 322 and 342 via a transfer gate drive wiring 212. Further, a transfer signal TGL1 from the row scanning circuit 210 is input to the gates of the transfer transistors 352 and 372 via a transfer gate drive wiring 213. The transfer signal TGR1 from the row scanning circuit 210 is input to the gates of the transfer transistors 362 and 382 via a transfer gate drive wiring 214.

The drain of the reset transistor 383 is connected to the row scanning circuit 210 by a reset drain drive wiring 215. A reset drain signal RSTd is input to the drain of the reset transistor 383 via the reset drain drive wiring 215, and a reset gate signal RSTg is input to the gate thereof via a reset gate drive wiring 216.

The drain of the amplification transistor 385 is connected to the power supply terminal via a power supply line 303. A selection signal SEL from the row scanning circuit 210 is input to the gate of the selection transistor 386 via a selection gate drive wiring 217. Further, with the row of the FD sharing block 301 as the FD row, the sources of the selection transistors 386 of the even-numbered FD rows are connected to the column signal processing unit 240 via a vertical signal line 304. On the other hand, the sources of the selection transistors 386 of the odd-numbered FD rows are connected to the column signal processing unit 230 via a vertical signal line 305.

The photoelectric conversion elements 311 and 321 receive a pair of pupil-split light rays. Similarly, the photoelectric conversion elements 331 and 341, the photoelectric conversion elements 351 and 361, and the photoelectric conversion elements 371 and 381 also respectively receive a pair of pupil-split light rays.

The transfer transistor 312 transfers an electric charge (electrons or the like) from the photoelectric conversion element 311 to the floating diffusion layer 384 in accordance with the transfer signal TGL0. Similarly, the transfer transistors 322, 332, 342, 352, 362, 372, and 382 also transfer charges from the respectively corresponding photoelectric conversion elements to the floating diffusion layer 384 in accordance with the corresponding transfer signals.

The floating diffusion layer 384 accumulates electric charges and generates a pixel signal having a voltage corresponding to the amount of the electric charges. Since the eight pixels supply the floating diffusion layer 384, each pixel signal of the eight pixels is generated one by one in order.

The reset transistor 383 sets the charge amount of the floating diffusion layer 384 to an initial value in accordance with the reset gate signal RSTg. Further, the row scanning circuit 210 can control the drain potential of the reset transistor 383 by the reset drain signal RSTd. The details of the control content will be described later.

The amplification transistor 385 amplifies the pixel signal and supplies the amplified signal to the selection transistor 386. The selection transistor 386 outputs the amplified pixel signal to the corresponding vertical signal line in accordance with the selection signal SEL.

It should be noted that although the floating diffusion layer 384 is shared by 8 pixels, the number of pixels sharing the floating diffusion layer 384 is not limited to 8 pixels, and may be 2 pixels or 4 pixels.

Figure 6:
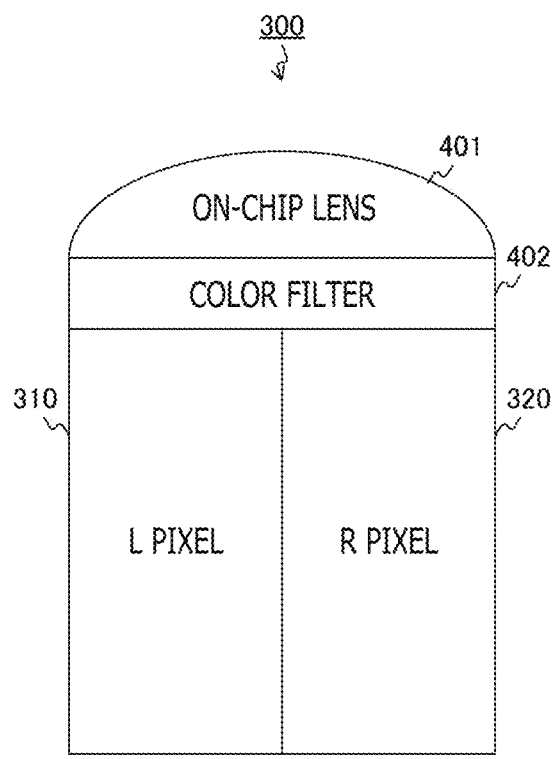
FIG. 6 is an example of a cross-sectional view of the pixel array unit according to the first embodiment of the present technology.

FIG. 6 is an example of a cross-sectional view of the pixel array unit 300 according to the first embodiment of the technique. A color filter 402 is arranged on the upper portion of the pair of L pixel and R pixel (L pixel 310, R pixel 320, etc.) with the direction toward the optical unit 110 as the upward direction in the Z direction. Further, an on-chip lens 401 is disposed on the upper part of the color filter 402.

The on-chip lens 401 collects light and guides the light to the color filter 402. The color filter 402 allows the light ray having a wavelength within a predetermined wavelength region to pass the filter among rays coming from the on-chip lens 401.

As exemplified in the figure, the pair of pixels share the color filter 402. Therefore, the image processing unit 260 can generate pixel data of one pixel in the color image data by synthesizing the respective pixel signals of those pixels. Since four pairs of pixels are arranged in the FD sharing block 301, four pixel data can be generated from these pixel signals. Note that the image processing unit 260 is an example of the processing unit described in the claims.

Figure 7:
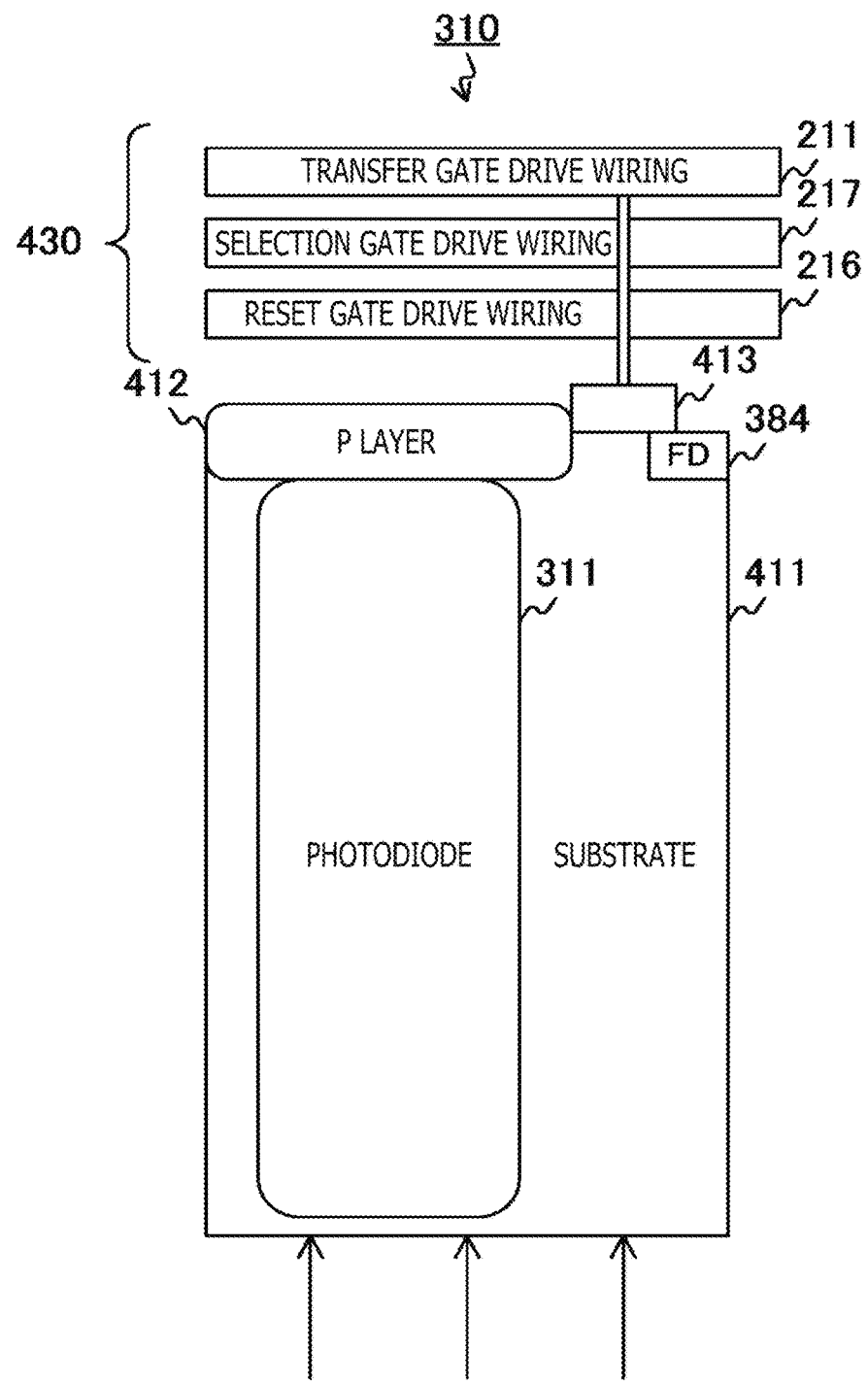
FIG. 7 is an example of a cross-sectional view of a pixel according to the first embodiment of the present technology.

FIG. 7 is an example of a cross-sectional view of a pixel (L pixel 310 etc.) according to the first embodiment of the present technology. The figure illustrates a cross-sectional view when the L pixel 310 is sectioned along the line A-B on the plan view exemplified in FIG. 4.

The photoelectric conversion element 311 is disposed in a substrate 411. Further, a P layer 412 is formed on the upper portion of the photoelectric conversion element 311 with the direction toward the optical unit 110 as the downward direction in the Z direction. A transfer gate 413, which is a gate electrode of the transfer transistor 312, is disposed on the substrate 411 and adjacent to the P layer 412. Further, on the substrate 411, the floating diffusion layer 384 is formed adjacent to a transfer gate 413.

Further, a wiring layer 430 is arranged above the substrate 411, and in the wiring layer 430, the transfer gate drive wiring 211, the selection gate drive wiring 217, and the reset gate drive wiring 216 are arranged to extend in the X direction (row direction). The transfer gate 413 is connected to the transfer gate drive wiring 211.

Figure 8:
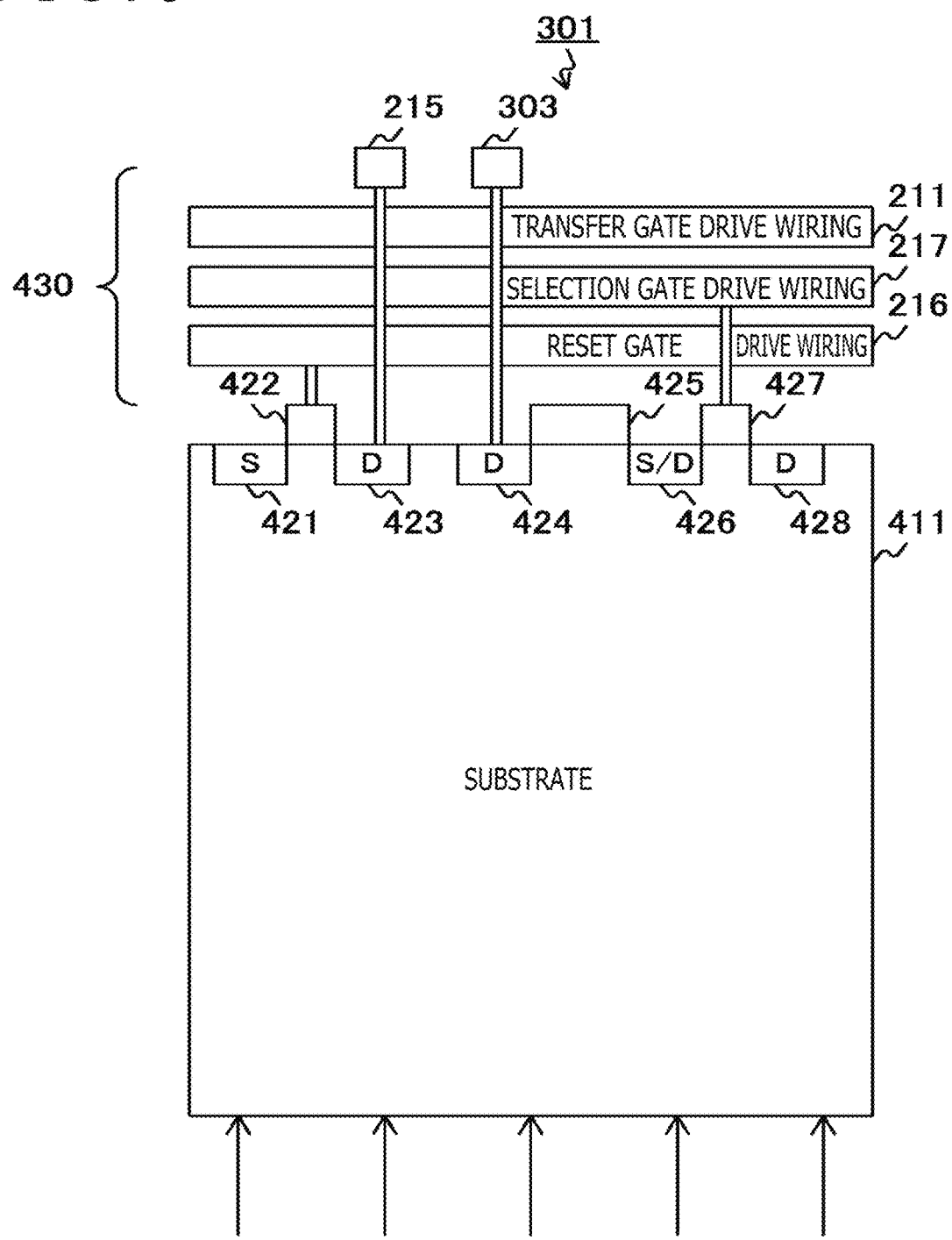
FIG. 8 is an example of a cross-sectional view of the FD sharing block according to the first embodiment of the present technology.

FIG. 8 is an example of a cross-sectional view of the FD sharing block 301 according to the first embodiment of the present technology. The figure illustrates a cross-sectional view when the FD sharing block 301 is sectioned along the line E-F on the plan view exemplified in FIG. 4. The substrate 411 is provided with a reset source 421, a reset drain 423, an amplifier drain 424, a source/drain 426, and a selection source 428.

The reset source 421 and the reset drain 423 are the source and drain of the reset transistor 383, and a reset gate 422, which is a gate of the reset transistor 383, is arranged between the source and drain. Further, the reset gate 422 is connected to the reset gate drive wiring 216. The reset drain 423 is connected to the reset drain drive wiring 215.

The amplifier drain 424 is the drain of the amplification transistor 385, and the source/drain 426 is used as both the source of the amplification transistor 385 and the drain of the selection transistor 386. The amplifier drain 424 is connected to the power supply line 303. Further, an amplifier gate 425, which is a gate of the amplification transistor 385, is arranged between the amplifier drain 424 and the source/drain 426. The amplifier gate 425 is connected to the reset source 421, and the signal line connecting these components is omitted in the figure.

The selection source 428 is the source of the selection transistor 386, and a selection gate 427, which is a gate of the selection transistor 386, is arranged between the source/ drain 426 and the selection source 428. The selection gate 427 is connected to the selection gate drive wiring 217.

Figure 9:
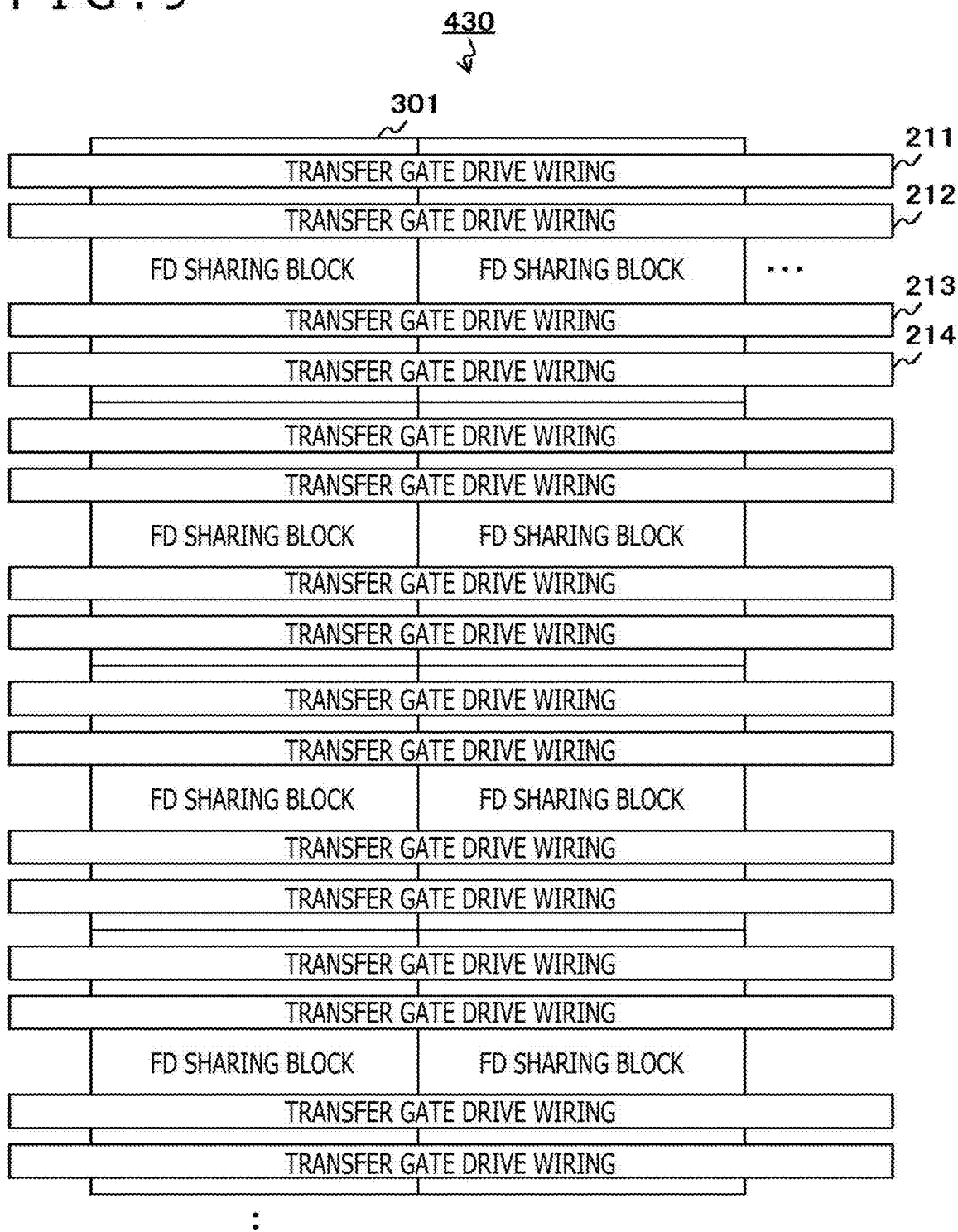
FIG. 9 is a plan view illustrating a wiring example of a transfer gate drive wiring according to the first embodiment of the present technology.

FIG. 9 is a plan view illustrating a wiring example of the transfer gate drive wirings 211 to 214 according to the first embodiment of the present technology. As exemplified in the figure, the transfer gate drive wirings 211 to 214 are arranged to extend in the X direction (row direction) for each FD row.

Figure 10:
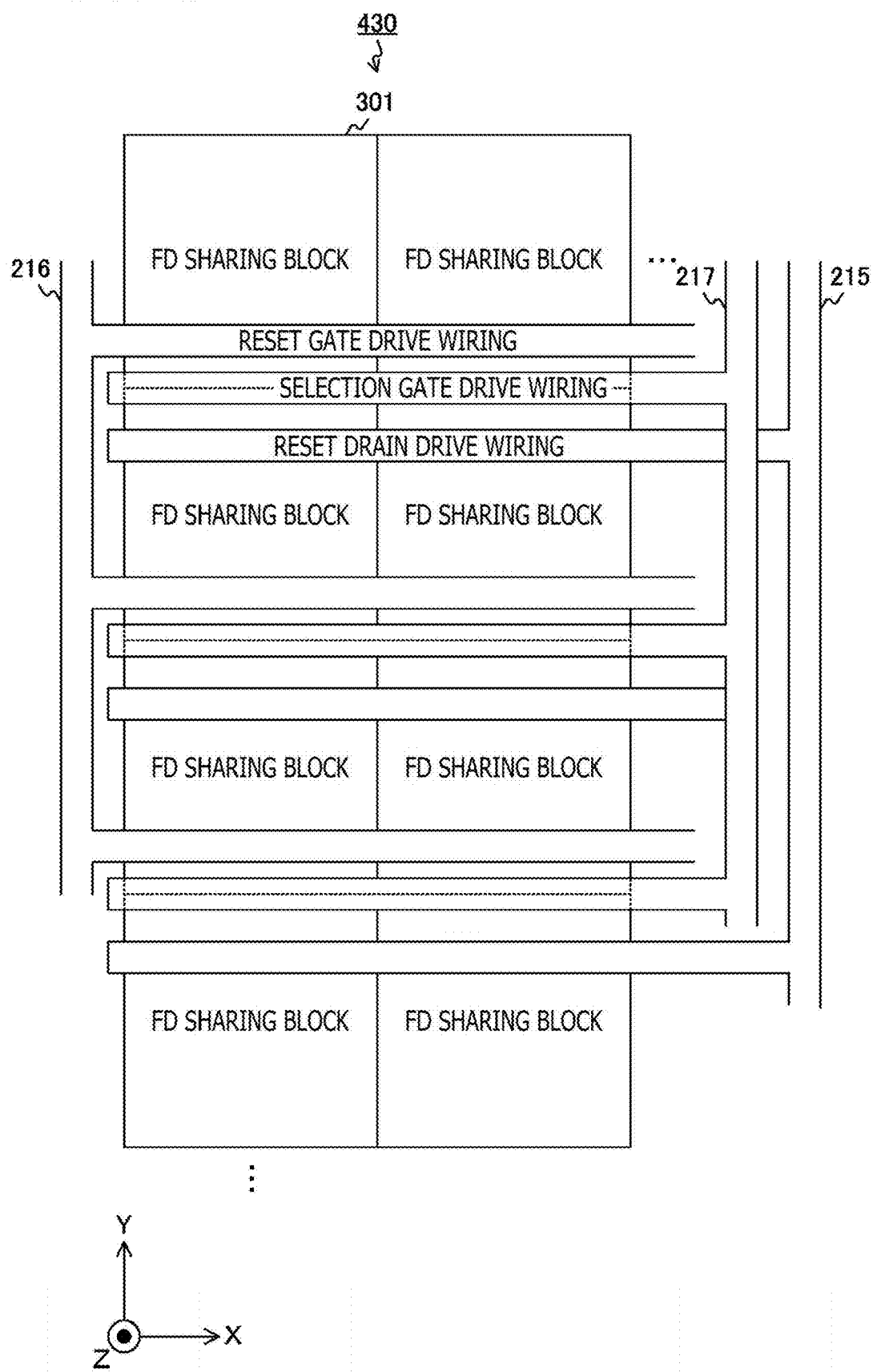
FIG. 10 is a plan view illustrating a wiring example of a reset gate drive wiring, a selection gate drive wiring, and a reset drain drive wiring according to the first embodiment of the present technology.

FIG. 10 is a plan view illustrating a wiring example of the reset gate drive wiring 216, the selection gate drive wiring 217, and the reset drain drive wiring 215 according to the first embodiment of the present technology. As exemplified in the figure, in addition to the reset gate drive wiring 216 and the selection gate drive wiring 217, the reset drain drive wiring 215 is further arranged to extend in the X direction (row direction) for each FD row.

Figure 11:
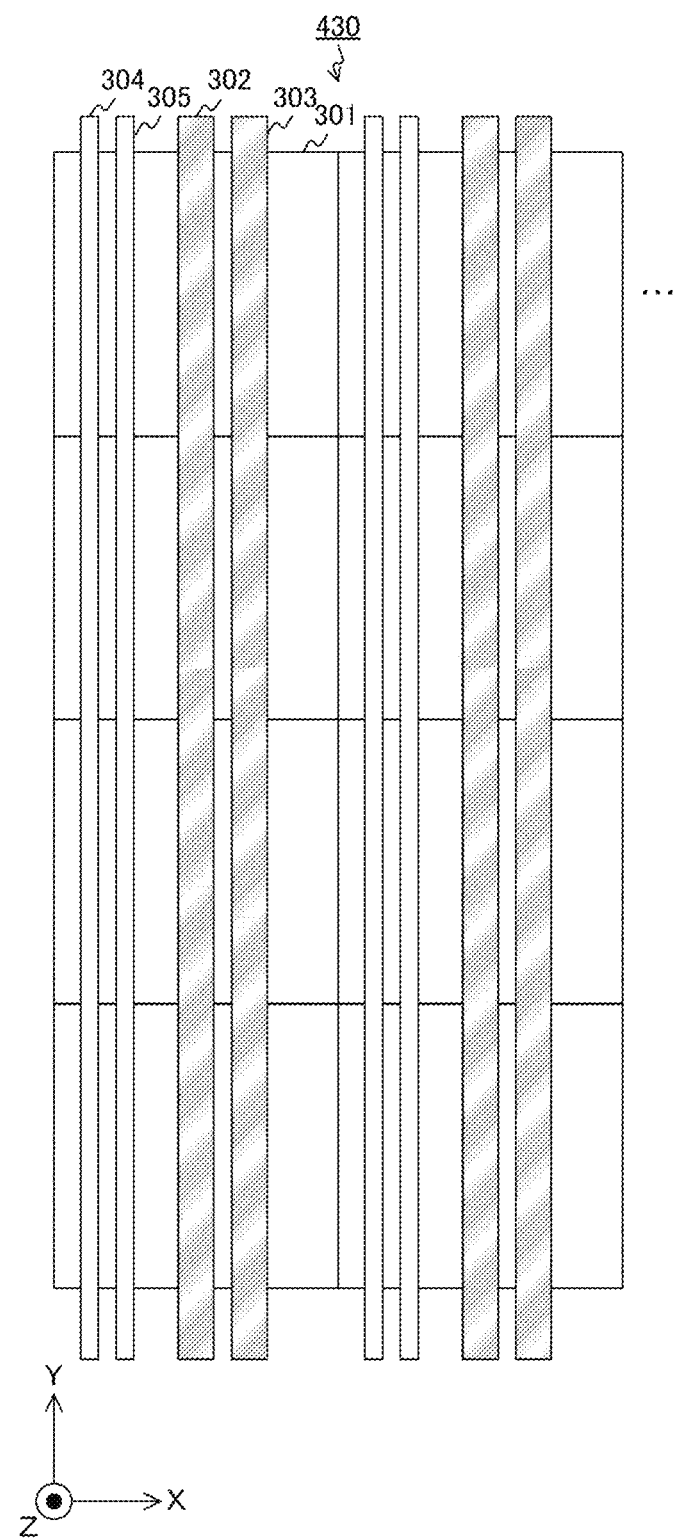
FIG. 11 is a plan view illustrating a wiring example of a vertical signal line, a power supply line, and a ground line according to the first embodiment of the present technology.

FIG. 11 is a plan view illustrating an example of wiring of the vertical signal lines 304 and 305, the power supply line 303, and the ground line 302 in the first embodiment of the present technology. With the row of the FD sharing block 301 as the FD column, the vertical signal lines 304 and 305, the power supply line 303, and the ground line 302 are arranged to extend in the Y direction (column direction) for each FD column.

Figure 12:
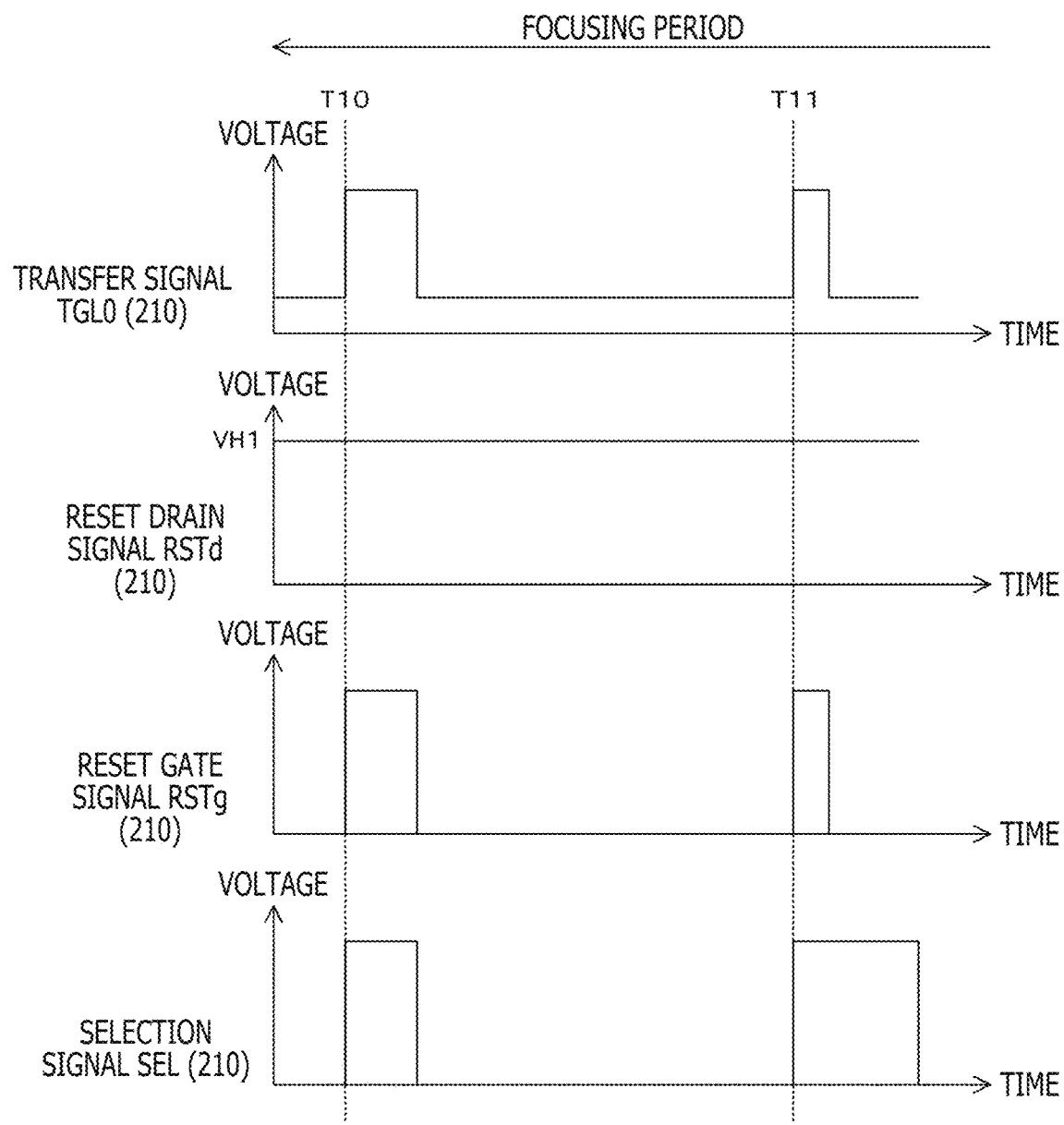
FIG. 12 is a timing chart illustrating an example of the operation of the solid-state imaging element during the focusing period in the first embodiment of the present technology.

FIG. 12 is a timing chart illustrating an example of the operation of the solid-state imaging element 200 in the focusing period in the first embodiment of the present technology. At the exposure start timing T10, the row scanning circuit 210 supplies a high-level transfer signal TGL0, the reset gate signal RSTg, and the selection signal SEL over a fixed pulse period. As a result, the floating diffusion layer in the L pixel corresponding to the transfer signal TGL0 is initialized.

Then, at the timing T11 that is the end of the exposure period, the row scanning circuit 210 supplies the high-level transfer signal TGL0 and the reset gate signal RSTg over a fixed pulse period. Further, the row scanning circuit 210 supplies a high-level selection signal SEL over the period from the timing T11 to the completion of the AD conversion. As a result, a pixel signal corresponding to the exposure amount is output from the L pixel corresponding to the transfer signal TGL0.

After the reading of the L pixel is completed, the R pixel is read by a similar procedure. Reading of these L pixels and R pixels is executed row by row. The focusing unit 250 detects a phase difference from each pixel signal of the L pixel and the R pixel, and obtains the focusing position of the focus lens from the phase difference.

In this focusing period, the row scanning circuit 210 supplies the reset drain signal RSTd of the high level VH1.

Figure 13:
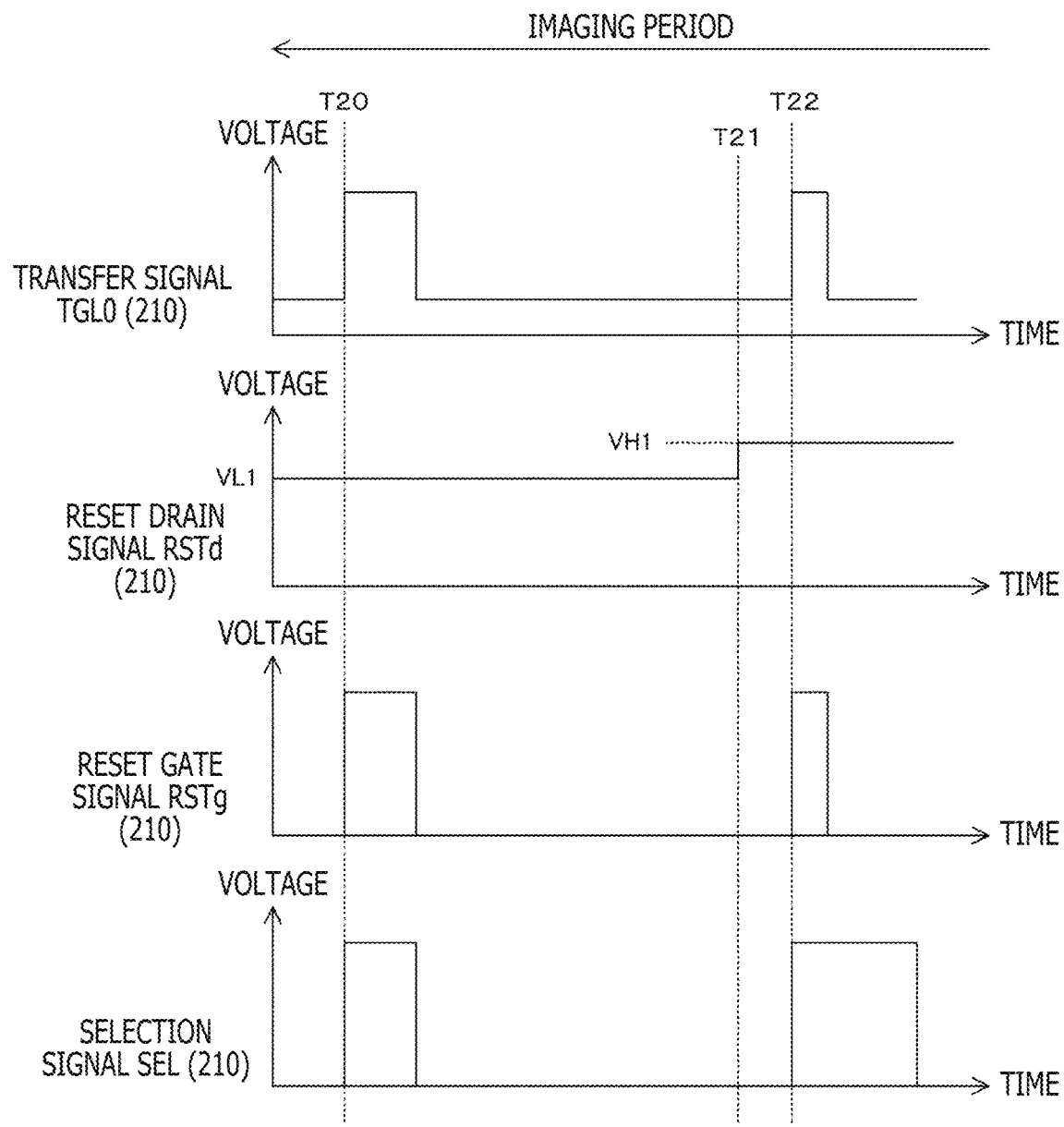
FIG. 13 is a timing chart illustrating an example of the operation of the solid-state imaging element during the imaging period in the first embodiment of the present technology.

FIG. 13 is a timing chart illustrating an example of the operation of the solid-state imaging element 200 during the imaging period in the first embodiment of the present technology. At the exposure start timing T20, the row scanning circuit 210 supplies the high level transfer signal TGL0, the reset gate signal RSTg, and the selection signal SEL over a fixed pulse period. Due to this, the floating diffusion layer in the L pixel corresponding to the transfer signal TGL0 is initialized.

Then, at the timing T22 of the end of the exposure period, the row scanning circuit 210 supplies the high-level transfer signal TGL0 and the reset gate signal RSTg over a fixed pulse period. Further, the row scanning circuit 210 supplies the high-level selection signal SEL over the period from the timing T11 to the completion of the AD conversion. As a result, a pixel signal corresponding to the exposure amount is output from the L pixel corresponding to the transfer signal TGL0.

Further, the row scanning circuit 210 takes control to change the reset drain signal RSTd from the low level VL1 to the high level VH1 at the timing T21 immediately before the end of the exposure.

As exemplified in FIGS. 12 and 13, the row scanning circuit 210 supplies, during the focusing period, the reset drain signal RSTd of the high level VH1 higher than the low level VL1 in the imaging period. As a result, control is taken so that the drain potential of the reset transistor 383 in the focusing period is set to a value higher than that in the imaging period.

Figure 14:
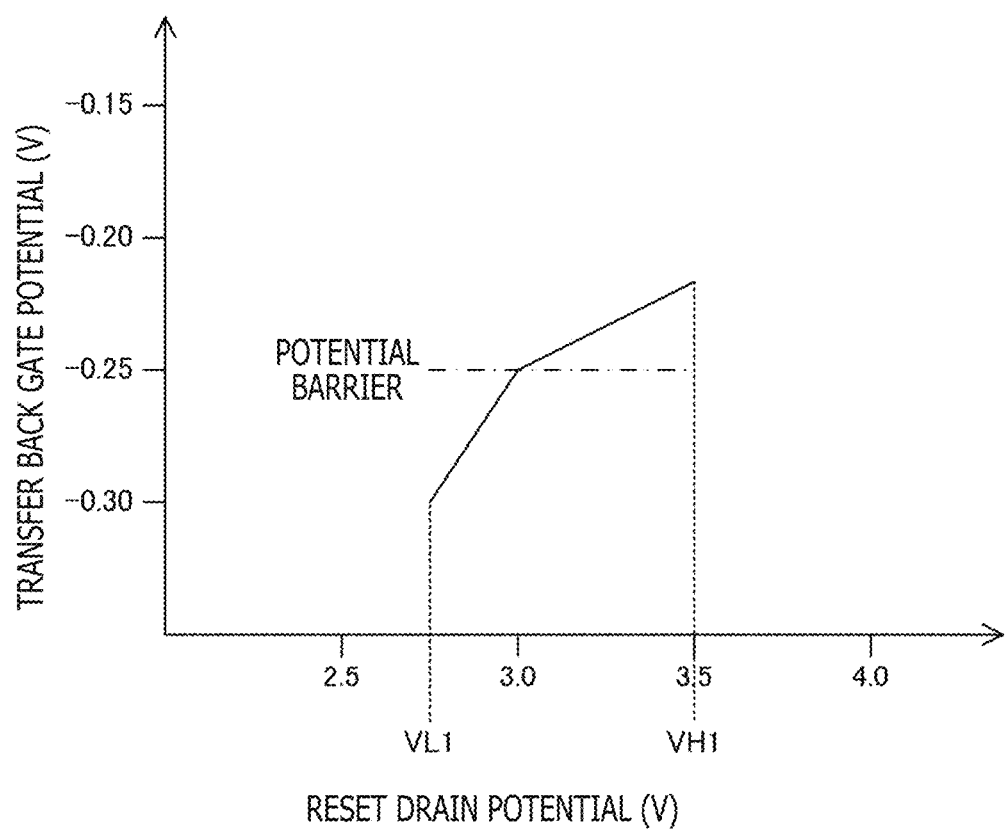
FIG. 14 is a graph illustrating an example of the relationship between a reset drain potential and a transfer back gate potential in the first embodiment of the present technology.

FIG. 14 is a graph illustrating an example of the relationship between the reset drain potential and the transfer back gate potential in the first embodiment of the present technology. The horizontal axis in the figure represents the reset drain potential, which is the drain potential of the reset transistor 383. The vertical axis in the figure represents the transfer back gate potential, which is the back gate potential of the transfer transistor 312. Further, in the figure, the dash dotted line indicates the potential of the potential barrier between the L pixel 310 and the R pixel 320.

As exemplified in the figure, as the reset drain potential is made higher, the transfer back gate potential becomes higher. This is because the drain current of the reset transistor 383 in the on-state increases as the reset drain potential increases, which increases the potential of the floating diffusion layer 384 at the time of initialization, and the potential of the substrate 411 (back gate potential) provided with the floating diffusion layer 384 also increases.

The row scanning circuit 210 takes control so that the transfer back gate potential has a value equal to or higher than the potential barrier by the reset drain signal RSTd of the high level VH1 during the focusing period. On the other hand, during the imaging period, the row scanning circuit 210 takes control so that the transfer back gate potential has a value lower than the potential barrier by the reset drain signal RSTd of the low level VL1. That is, the value of the transfer back gate voltage, which is the transfer back gate potential with respect to the potential barrier, is controlled in the focusing period to be set to a value different from that in the imaging period. Note that the row scanning circuit 210 is an example of the control unit described in the claims.

Figure 15:
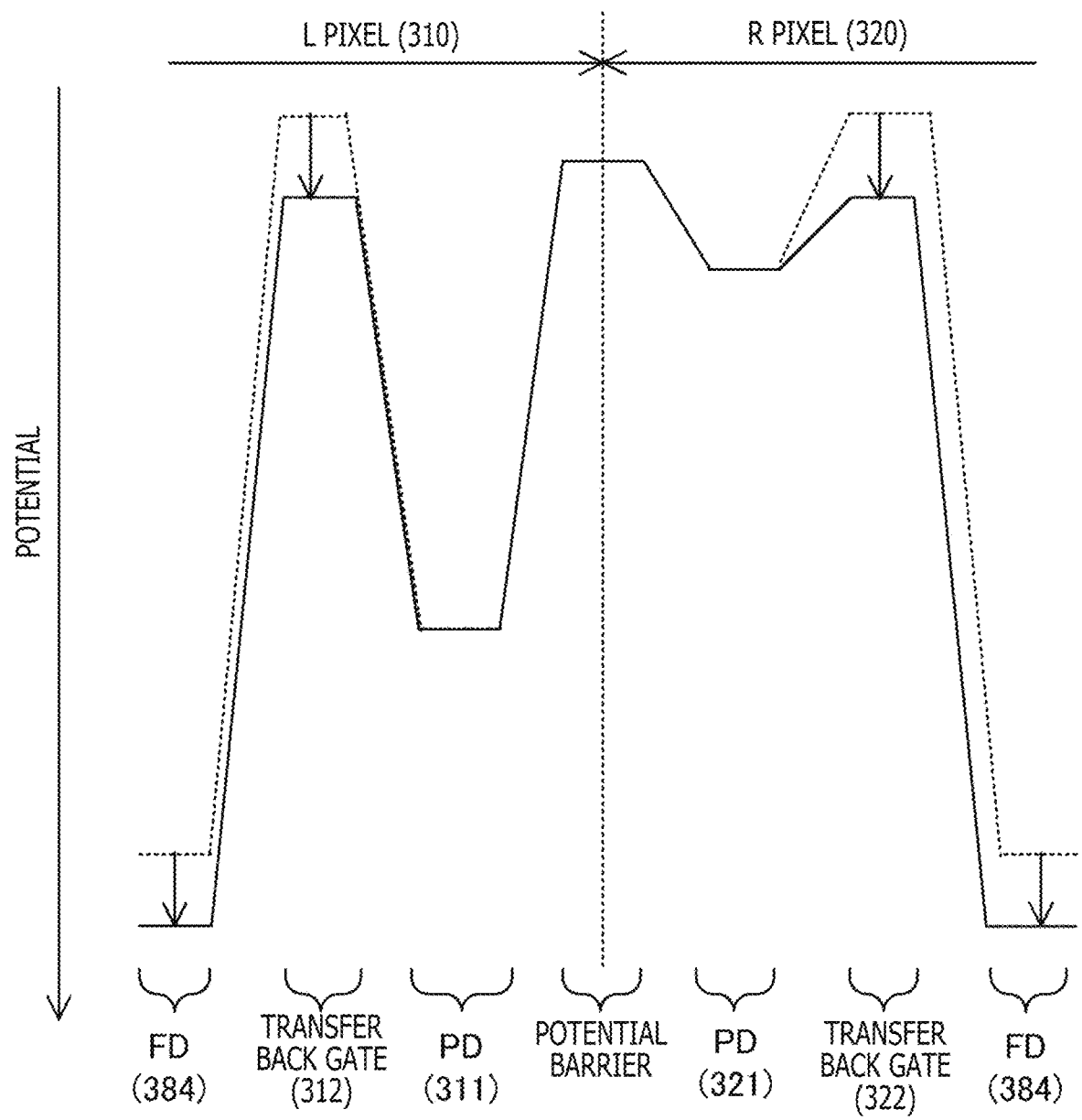
FIG. 15 is an example of a potential diagram at the time of focusing in the first embodiment of the present technology.

FIG. 15 is an example of a potential diagram at the time of focusing in the first embodiment of the present technology. The figure illustrates the potential before charge transfer along the line C-D in the plan view exemplified in FIG. 4 in the focusing period. In the figure, it is indicated that the potential becomes lower according to the downward arrow direction. The dotted line represents the potential of the comparative example in which the reset drain potential during the focusing period is the same as that in the imaging period. Further, the solid line indicates the potential in the solid-state imaging element 200 that takes control so that the reset drain potential during the focusing period has a value higher than that in the imaging period.

The potentials of the photoelectric conversion elements 311 and 321 fluctuate in accordance with the amount of generated electric charges (electrons and the like). For example, in the R pixel 320, in the case where electrons more than in the R pixel 320 are generated by the photoelectric conversion, the potential of the photoelectric conversion element 321 in the R pixel 320 becomes lower than that in the photoelectric conversion element 311 in the L pixel 310.

In the comparative example in which the reset drain potential is not controlled, the transfer back gate potentials of both the transfer transistors 312 and 322 are lower than the potential barrier between the photoelectric conversion elements 311 and 321. In this configuration, in the case where the amount of received light is large, for example, the electrons overflowing from the R pixel 320 may flow over the potential barrier into the L pixel 310. In this case, the signals of the L pixel 310 and the R pixel 320 are mixed to cause color mixing. When color mixing occurs, the detection accuracy of the phase difference may decrease.

On the other hand, the row scanning circuit 210 takes control so that the reset drain potential during the focusing period has a value higher than that in the imaging period. When the reset drain potential becomes high, the transfer back gate potential becomes high as described above, and has a value higher than the potential barrier. As a result, color mixing can be prevented, and the phase difference detection accuracy can be improved.

Note that the solid-state imaging element 200 accumulates electrons as electric charges and takes control so that the reset drain potential at the time of focusing is higher than that at the time of imaging, but the configuration is not limited to this. Holes may be accumulated as the electric charges. In this case, it is sufficient if the row scanning circuit 210 makes the reset drain potential at the time of focusing lower than that at the time of imaging.

Figure 16:
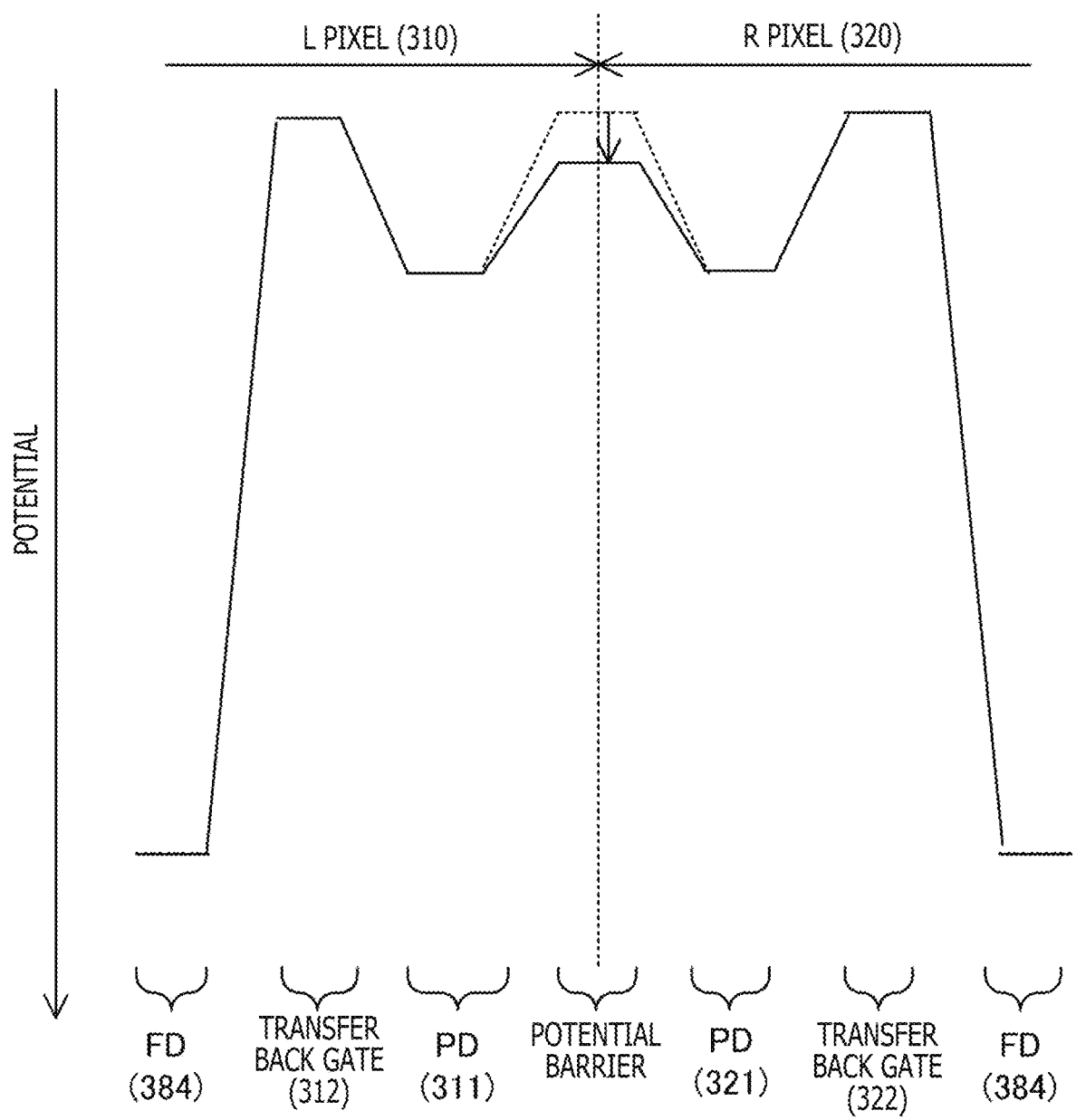
FIG. 16 is an example of a potential diagram at the time of imaging in the first embodiment of the present technology.

FIG. 16 is an example of a potential diagram at the time of imaging in the first embodiment of the present technology. The figure illustrates the potential before charge transfer along the line C-D in the plan view exemplified in FIG. 4 during the imaging period. The dotted line represents the potential of the comparative example in which the reset drain potential during the imaging period is the same as that in the focusing period. Further, the solid line indicates the potential in the solid-state imaging element 200 that takes control so that the reset drain potential during the imaging period has a value lower than that of the focusing period.

In the comparative example in which the reset drain potential is not controlled, the potential barrier between the photoelectric conversion elements 311 and 321 has a value equal to or higher than the transfer back gate potentials of both the transfer transistors 312 and 322. In this configuration, the saturation signal amount when the total signal amounts of the L pixel 310 and the R pixel 320 are saturated may not be sufficiently increased. This is because the electrons generated by the photoelectric conversion elements 311 and 321 cannot go over the potential barrier and are discharged from the back gate of the transfer transistors 312 and 322. Further, the potential barrier varies from pixel to pixel. Therefore, the saturation signal amount may vary from pixel to pixel.

On the other hand, the row scanning circuit 210 takes control so that the reset drain potential during the imaging period has a value lower than that in the focusing period. When the reset drain potential becomes lower, the transfer back gate potential becomes lower as described above, and has a value lower than the potential barrier. As a result, it is possible to suppress the discharge of electrons from the back gates of the transfer transistors 312 and 322, and to increase the saturation signal amount as compared with the comparative example.

Figure 17:
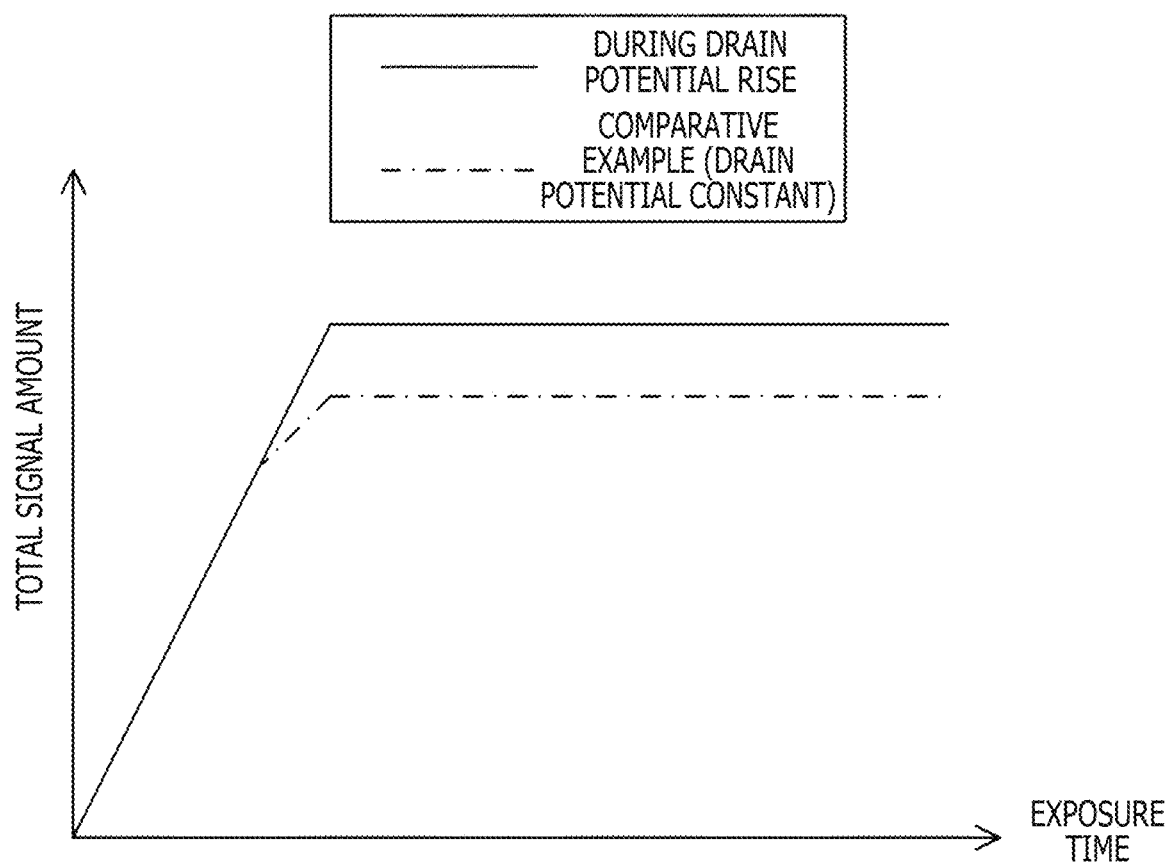
FIG. 17 is a graph illustrating an example of the total signal amount according to the exposure time in the first embodiment of the present technology.

FIG. 17 is a graph illustrating an example of the total signal amount according to the exposure time in the first embodiment of the present technology. The vertical axis in the figure represents the total signal amount which is the total of the pixel signals of each of the L pixel 310 and the R pixel 320. The horizontal axis in the figure indicates the exposure time. Further, the solid line in the figure represents the fluctuation of the total signal amount in the solid-state imaging element 200 that makes the reset drain potential at the time of imaging higher than that at the time of focusing. Further, the dotted line in the figure represents the fluctuation of the total signal amount of the comparative example in which the reset drain potential is constant.

As the exposure time increases, the total signal amount increases linearly and saturates after a certain exposure time. The saturation signal amount at this time is increased as compared with the comparative example by making the reset drain potential lower than that at the time of focusing. This makes it possible to ensure the linearity of the total signal amount at the time of imaging and improve the image quality of the image data.

Figure 18:
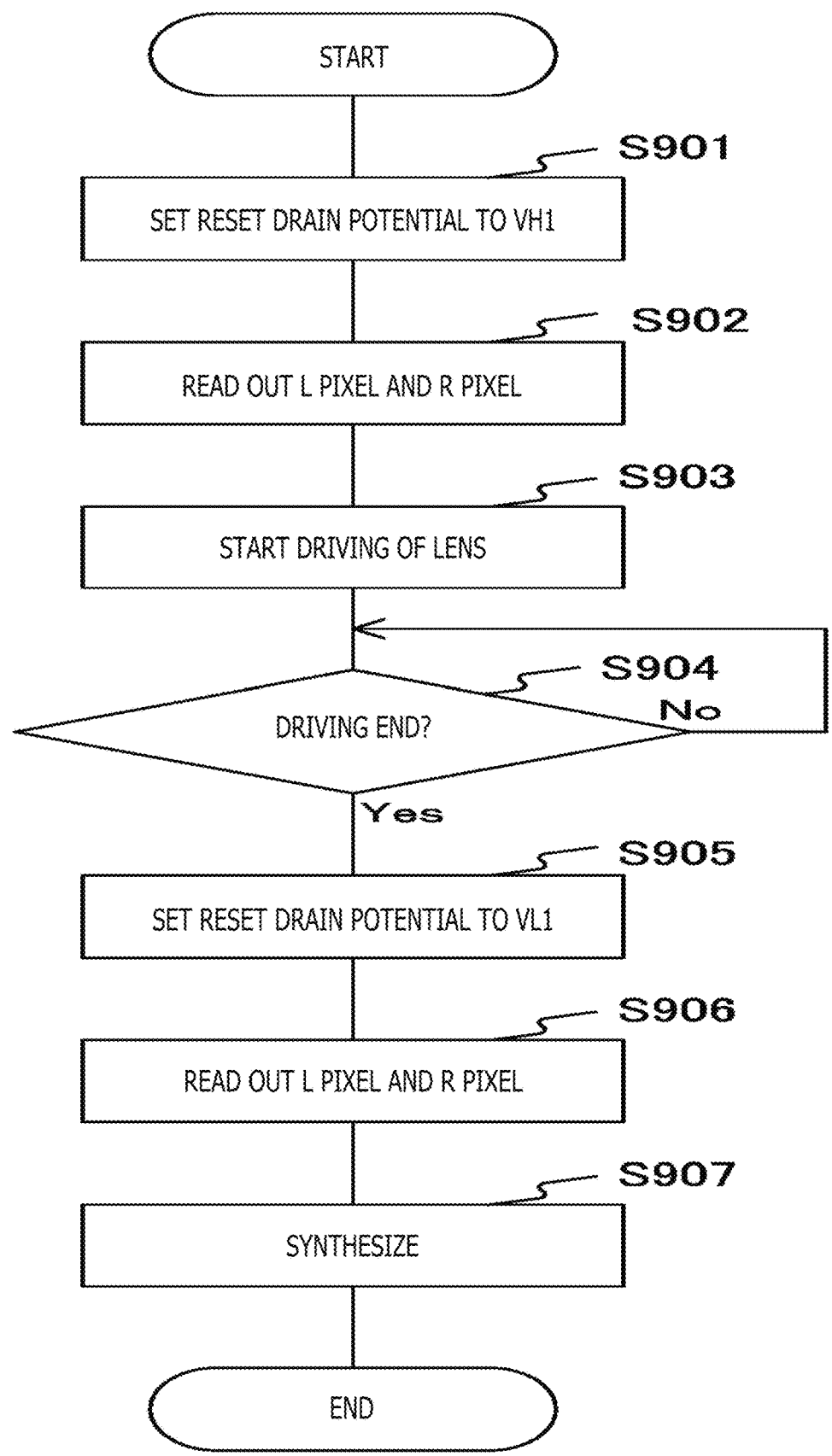
FIG. 18 is a flowchart illustrating an example of the operation of the solid-state imaging element according to the first embodiment of the present technology.

FIG. 18 is a flowchart illustrating an example of the operation of the solid-state imaging element 200 according to the first embodiment of the present technology. This operation is started, for example, when a predetermined application for capturing image data is executed.

The row scanning circuit 210 sets the reset drain potential to the high level VH1 (step S901), and reads out the pixel signal of each of the L pixel and the R pixel (step S902). Then, the focusing unit 250 detects the phase difference from the read pixel signal, and obtains the focusing position from the phase difference, thereby starting driving to move the focus lens to the focusing position (step S903). The focusing unit 250 determines whether or not the driving is completed (step S904). In the case where the driving is not completed (step S904: No), the focusing unit 250 repeats step S904.

In the case where the driving is completed (step S904: Yes), the row scanning circuit 210 sets the reset drain potential to the low level VL1 (step S905) and reads out the pixel signals of each of the L pixel and the R pixel (step S906). Then, the image processing unit 260 synthesizes the respective pixel signals of the L pixel and the R pixel to generate image data (step S907). After step S907, the solid-state imaging element 200 ends the operation for capturing image data.

As described above, according to the first embodiment of the present technology, the row scanning circuit 210 takes control so that the transfer back gate voltage, which is the transfer back gate potential with respect to the potential barrier at the time of focusing, has a value different from that at the time of imaging. Therefore, electrons can be prevented from moving between pixels beyond the potential barrier. This makes it possible to prevent color mixing and improve the accuracy of detecting the phase difference.

2. Second Embodiment

In the first embodiment described above, the row scanning circuit 210 controls the transfer back gate voltage by controlling the reset drain potential, but in this configuration, it is necessary to arrange the reset drain drive wiring 215 for controlling the reset drain potential for each FD row. Therefore, the number of wirings increases because of addition of the reset drain drive wirings 215. The row scanning circuit 210 of the second embodiment is different from that in the first embodiment in that the gate potential of the transfer transistor is controlled instead of the reset drain potential.

Figure 19:
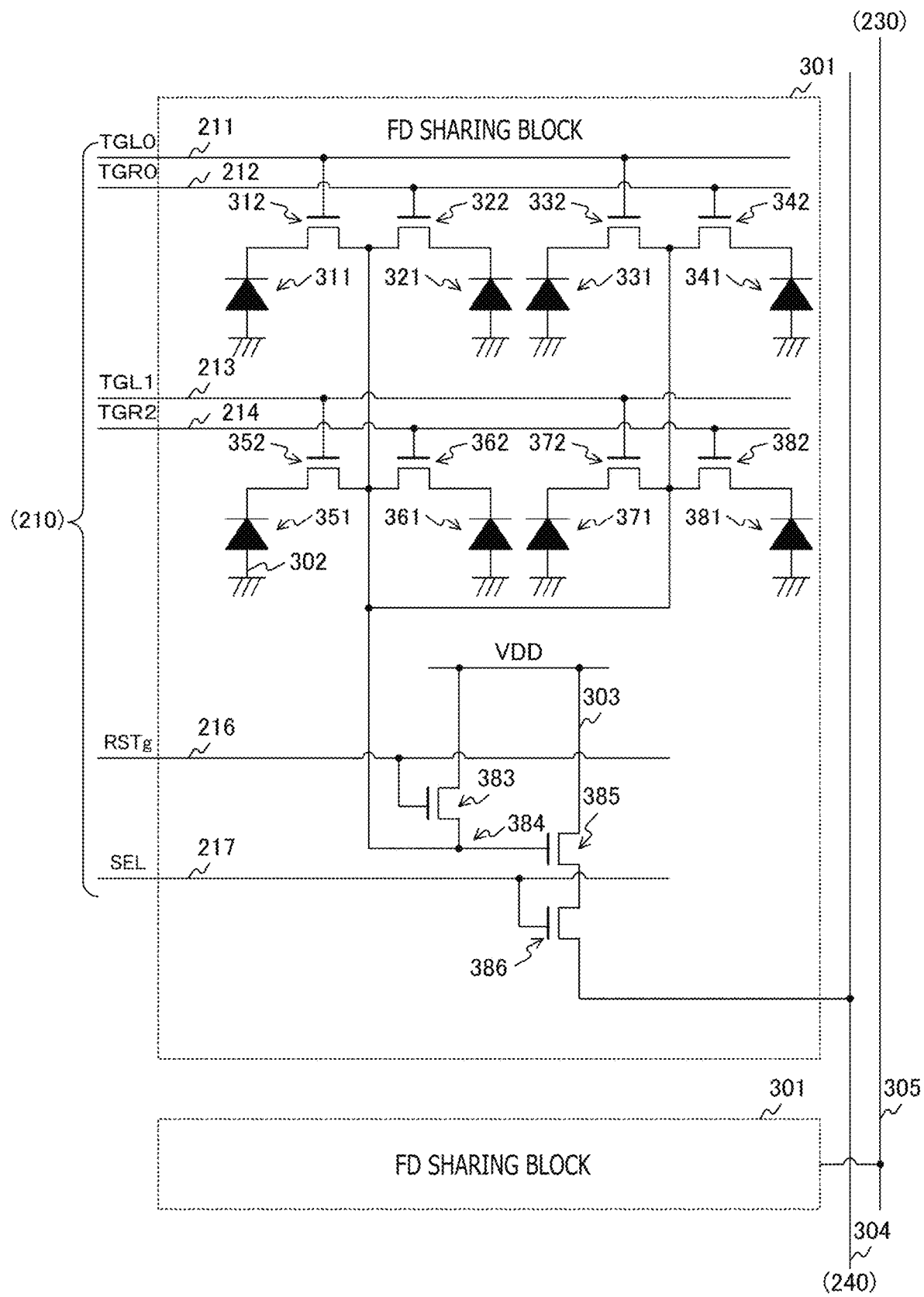
FIG. 19 is a circuit diagram illustrating a configuration example of an FD sharing block according to a second embodiment of the present technology.

FIG. 19 is a circuit diagram illustrating a configuration example of the FD sharing block 301 according to the second embodiment of the present technology. The FD sharing block 301 of the second embodiment is different from that of the first embodiment in that the reset drain drive wirings 215 are not arranged. The drain of the reset transistor 383 is connected together with the amplification transistor 385 to the power supply.

Figure 20:
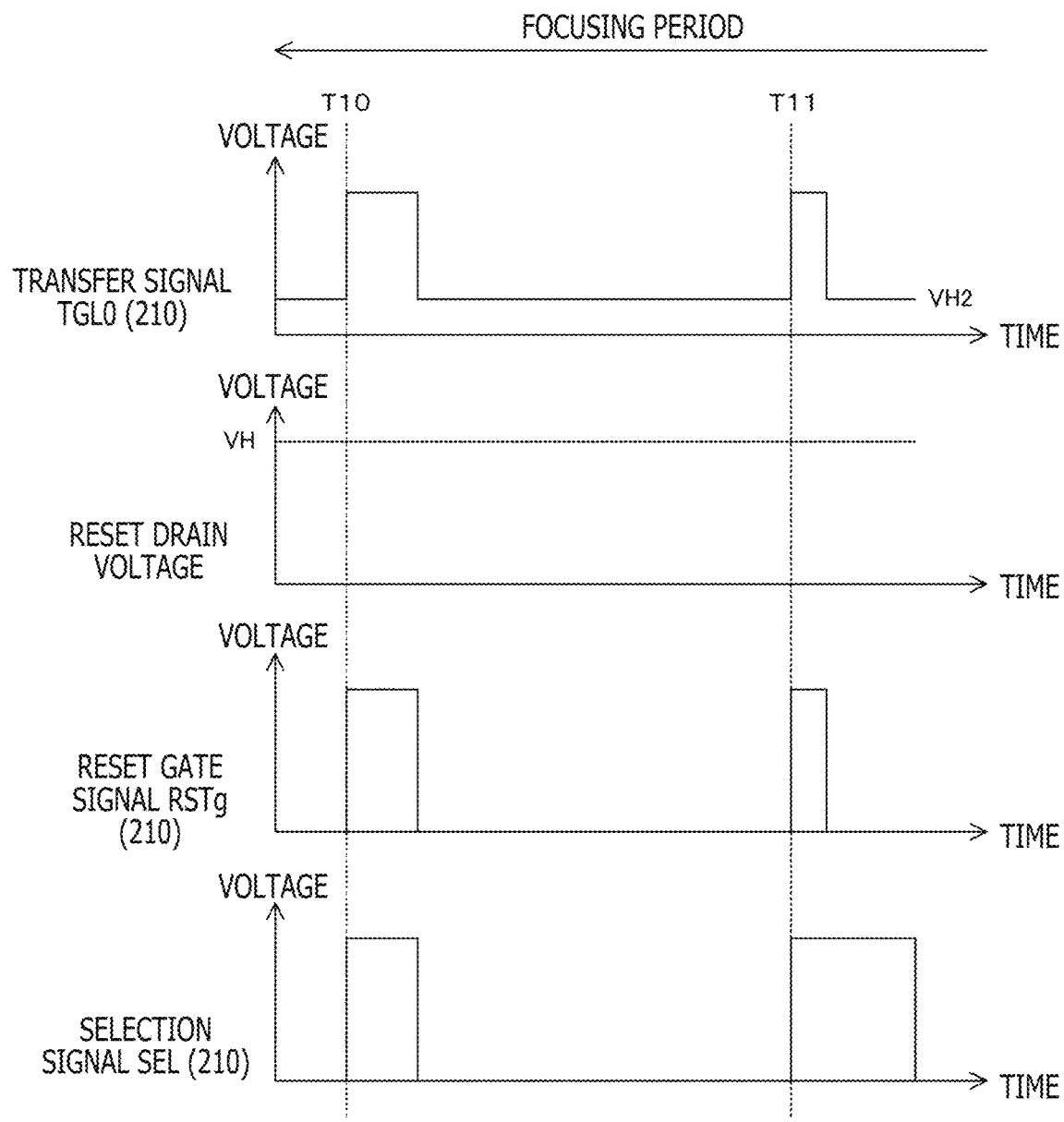
FIG. 20 is a timing chart illustrating an example of the operation of a solid-state imaging element during the focusing period in the second embodiment of the present technology.

FIG. 20 is a timing chart illustrating an example of the operation of the solid-state imaging element 200 in the focusing period in the second embodiment of the present technology. The control timing of the transfer signal TGL0, the reset gate signal RSTg, and the selection signal SEL in the second embodiment is similar to that in the first embodiment.

However, the low level of the transfer signal TGL0 is set to a value VH2 higher than the low level in the imaging period.

Figure 21:
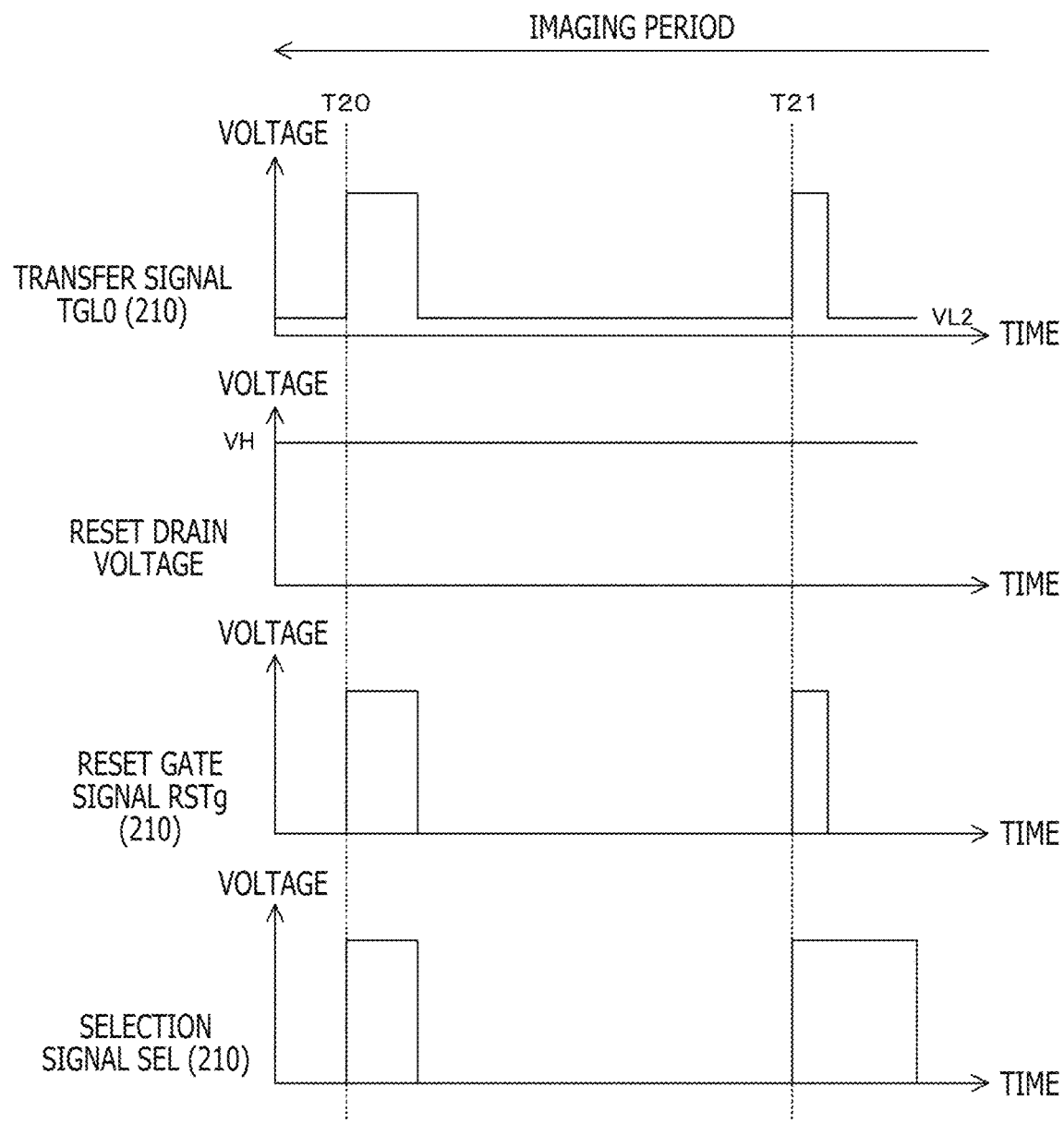
FIG. 21 is a timing chart illustrating an example of the operation of the solid-state imaging element during the imaging period in the second embodiment of the present technology.

FIG. 21 is a timing chart illustrating an example of the operation of the solid-state imaging element 200 during the imaging period in the second embodiment of the present technology. The control timing of the transfer signal TGL0, the reset gate signal RSTg, and the selection signal SEL in the second embodiment is similar to that in the first embodiment.

However, the low level of the transfer signal TGL0 is set to a value VL2 lower than the low level in the focusing period. Further, the reset drain voltage is controlled so as to have the same value as the value in the focusing period.

As exemplified in FIGS. 20 and 21, the row scanning circuit 210 takes control so that the low level of the transfer gate signal during focusing has a higher value than during imaging. As a result, the transfer back gate voltage at the time of focusing can be set to a value higher than that at the time of imaging as in the first embodiment.

As described above, according to the second embodiment of the present technology, since the row scanning circuit 210 makes the gate potential of the transfer transistor at the time of focusing higher than that at the time of imaging, the transfer back gate potential can be controlled without operating the reset drain potential. Due to this, it is not necessary to install the reset drain drive wiring, and the number of wirings can be reduced.

3. Application Example to Mobile Body

The technology related to the present disclosure (present technology) can be applied to various kinds of products. For example, the technology according to the present disclosure may be achieved as a device mounted on a mobile body of any kind such as an automobile, an electric vehicle, a hybrid electric vehicle, a motorcycle, a bicycle, a personal mobility, an airplane, a drone, a ship, and a robot.

Figure 22:
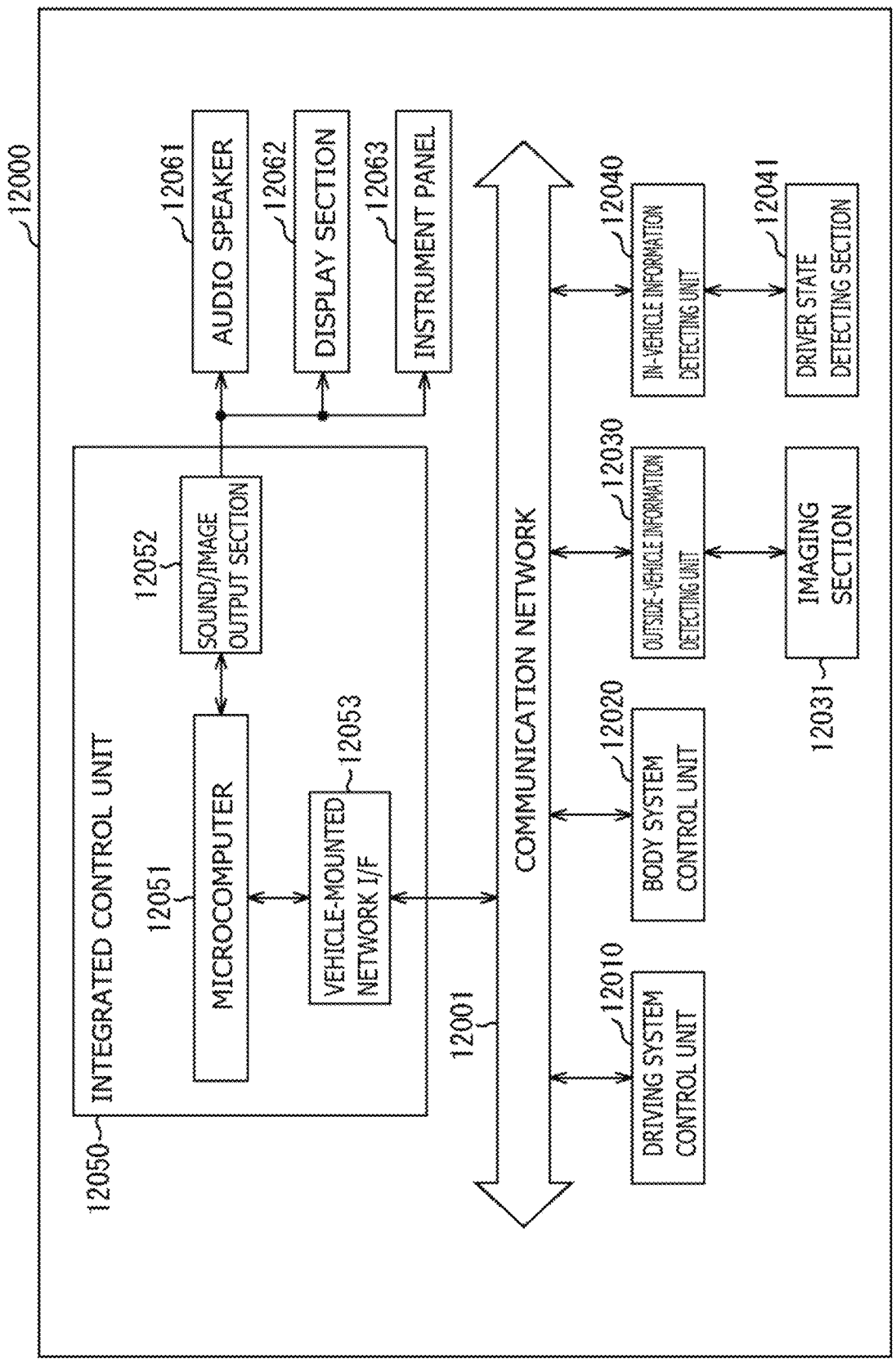
FIG. 22 is a block diagram depicting an example of schematic configuration of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
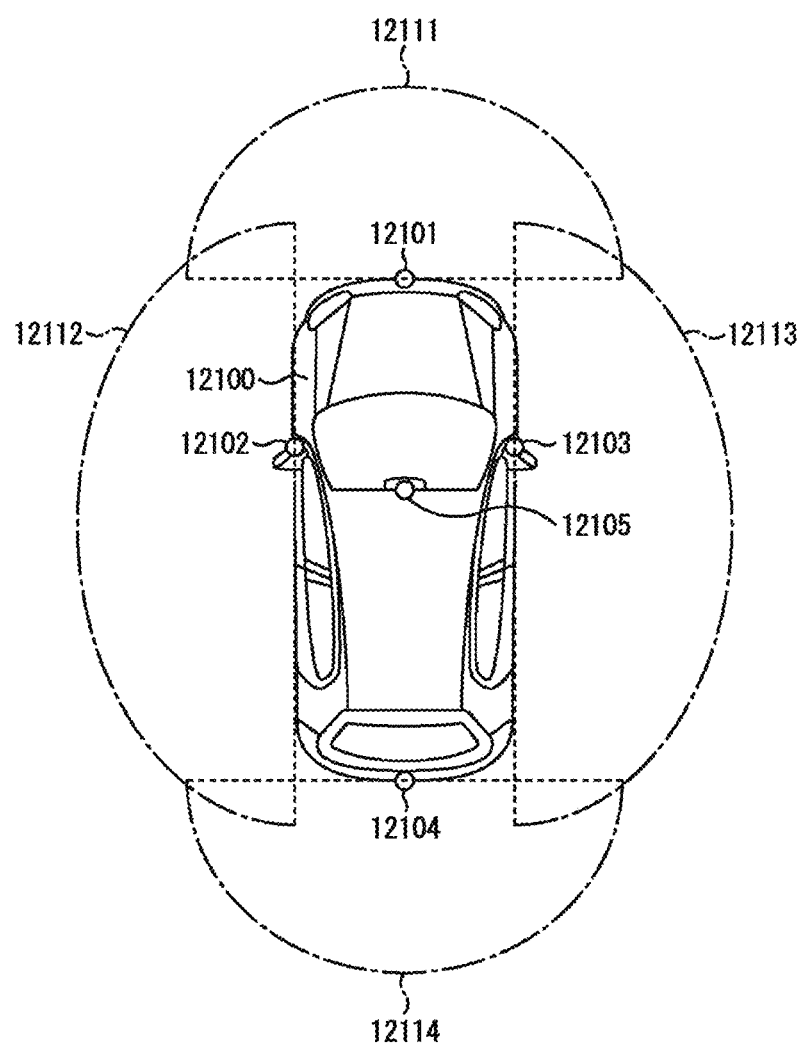
FIG. 23 is a diagram of assistance in explaining an example of installation positions of an outside-vehicle information detecting section and an imaging section.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technique according to the present disclosure can be applied has been described above. The technique according to the present disclosure can be applied to the imaging section 12031 among the configurations described above. To be specific, the imaging device 100 in FIG. 1 can be applied to the imaging section 12031. By applying the technique according to the present disclosure to the imaging section 12031, it is possible to improve the detection accuracy of the phase difference and obtain captured images that are easier to see, so that the driver's fatigue can be reduced.

It should be noted that the above-described embodiments demonstrate examples for embodying the present technology, and the matters in the embodiments and the matters specifying the invention in the claims have a correspondence relationship with each other. Similarly, the matters specifying the invention within the scope of claims and the matters in the embodiments of the present technology having the same names have a correspondence relationship with each other. However, the present technology is not limited to the embodiments, and can be embodied by applying various kinds of modifications to the embodiments without departing from the gist thereof.

It should be noted that the effects described in the present specification are merely examples and the technology is not limited thereto so that other effects may be obtained.

Note that the present technology can also have the following configurations.

(1) A solid-state imaging element including:
a pair of photoelectric conversion elements that receive a pair of light rays made by pupil-splitting;
a floating diffusion layer that generates a pair of pixel signals from electric charge transferred from each of the pair of photoelectric conversion elements;
a pair of transfer transistors that transfer the electric charge from the pair of photoelectric conversion elements to the floating diffusion layer; and
a control unit that takes control such that back gate voltages that include back gate potentials of both of the pair of transfer transistors with respect to a potential barrier between the pair of photoelectric conversion elements have values different from values in a case of synthesizing the pair of pixel signals, in a case of detecting a phase difference of the pair of light rays from the pair of pixel signals.

(2) The solid-state imaging element described in (1), further including:
a reset transistor that initializes an amount of the electric charge in the floating diffusion layer, in which
the control unit controls the back gate voltages by controlling a drain potential of the reset transistor.

(3) The solid-state imaging element described in (2), in which
a reset drain drive wiring is provided to connect a drain of the reset transistor and the control unit, and
the control unit controls the drain potential via the reset drain drive wiring.

(4) The solid-state imaging element described in (1), in which
the control unit controls the back gate voltages by controlling gate potentials of both of the pair of transfer transistors.

(5) The solid-state imaging element described in any one of (1) to (4), in which
the electric charge includes an electron, and
in the case of detecting the phase difference, the control unit takes control such that the back gate voltages are higher than those in the case of synthesizing the pair of pixel signals.

(6) The solid-state imaging element described in any one of (1) to (5), in which
in the case of synthesizing the pair of pixel signals, the control unit controls the back gate voltages after a start of exposure of the pair of photoelectric conversion elements.

(7) The solid-state imaging element described in any one of (1) to (6), further including:
an on-chip lens that collects a light ray; and
a color filter that allows a light ray having a wavelength within a predetermined wavelength range and coming from the on-chip lens to pass through the color filter, in which
the pair of photoelectric conversion elements receive the light ray that has passed through the color filter.

(8) An imaging device including:
a pair of photoelectric conversion elements that receive a pair of light rays made by pupil-splitting;
a floating diffusion layer that generates a pair of pixel signals from electric charge transferred from each of the pair of photoelectric conversion elements;
a pair of transfer transistors that transfer the electric charge from the pair of photoelectric conversion elements to the floating diffusion layer;
a control unit that takes control such that back gate voltages that include back gate potentials of both of the pair of transfer transistors with respect to a potential barrier between the pair of photoelectric conversion elements have values different from values in a case of synthesizing the pair of pixel signals, in a case of detecting a phase difference of the pair of light rays from the pair of pixel signals; and
a processing unit that performs a process of synthesizing the pair of pixel signals.

(9) A method for controlling a solid-state imaging element including the steps of:
transferring, by a pair of transfer transistors, electric charge from a pair of photoelectric conversion elements that receive a pair of light rays made by pupil-splitting to a floating diffusion layer that generates a pair of pixel signals from the electric charge transferred from each of the pair of photoelectric conversion elements; and
taking control such that back gate voltages that include back gate potentials of both of the pair of transfer transistors with respect to a potential barrier between the pair of photoelectric conversion elements have values different from values in a case of synthesizing the pair of pixel signals, in a case of detecting a phase difference of the pair of light rays from the pair of pixel signals.

REFERENCE SIGNS LIST

100 Imaging device
110 Optical unit
120 DSP circuit
130 Display unit
140 Operation unit
150 Bus
160 Frame memory
170 Storage unit
180 Power supply unit
200 Solid-state imaging element
210 Row scanning circuit
211 to 214 Transfer gate drive wiring
215 Reset drain drive wiring
216 Reset gate drive wiring 217 Selection gate drive wiring
220 Timing control unit
230, 240 Column signal processing unit
250 Focusing unit
260 Image processing unit
300 Pixel array unit
301 FD sharing block
302 Ground line
303 Power supply line
304, 305 Vertical signal line
310, 330, 350, 370 L pixel
311, 321, 331, 341, 351, 361, 371, 381 Photoelectric conversion element
312, 322, 332, 342, 352, 362, 372, 382 Transfer transistor
320, 340, 360, 380 R pixel
383 Reset transistor
384 Floating diffusion layer
385 Amplification transistor
386 Selection transistor
401 On-chip lens
402 Color filter
411 Substrate
412 P layer
413 Transfer gate
421 Reset source
422 Reset gate
423 Reset drain
424 Amplifier drain
425 Amplifier gate
426 Source/drain
427 Selection gate
428 Selection source
430 Wiring layer
12031 Imaging section

The invention claimed is:

1. A solid-state imaging element, comprising:
a pair of photoelectric conversion elements configured to receive a pair of pupil-split light rays;
a floating diffusion layer configured to generate a pair of pixel signals from electric charge transferred from each of the pair of photoelectric conversion elements;
a pair of transfer transistors configured to transfer the electric charge from the pair of photoelectric conversion elements to the floating diffusion layer;
a reset transistor configured to initialize an amount of the electric charge in the floating diffusion layer;
a reset drain drive wiring; and
a control unit configured to:
control a drain potential of the reset transistor via the reset drain drive wiring,
wherein the reset drain drive wiring connects a drain of the reset transistor and the control unit; and
control, based on the control of the drain potential of the reset transistor, back gate voltages to have one of first values in a case of synthesis of the pair of pixel signals, or
second values different from the first values in a case of detection of a phase difference of the pair of pupil-split light rays from the pair of pixel signals,
wherein the back gate voltages include back gate potentials of the pair of transfer transistors with respect to a potential barrier between the pair of photoelectric conversion elements.

2. The solid-state imaging element according to claim 1, wherein the control unit is further configured to control the back gate voltages by control of gate potentials of both of the pair of transfer transistors.

3. The solid-state imaging element according to claim 1, wherein
the electric charge includes an electron, and
in the case of the detection of the phase difference, the control unit is further configured to control the back gate voltages to have the second values that are higher than the first values.

4. The solid-state imaging element according to claim 1, wherein in the case of the synthesis of the pair of pixel signals, the control unit is further configured to control the back gate voltages after a start of exposure of the pair of photoelectric conversion elements.

5. The solid-state imaging element according to claim 1, further comprising:
an on-chip lens configured to collect a plurality of light rays; and
a color filter configured to allow a light ray of the plurality of light rays having a wavelength within a specific wavelength range and coming from the on-chip lens to pass through the color filter,
wherein the pair of photoelectric conversion elements is further configured to receive the light ray that has passed through the color filter.

6. An imaging device, comprising:
a pair of photoelectric conversion elements configured to receive a pair of pupil-split light rays;
a floating diffusion layer configured to generate a pair of pixel signals from electric charge transferred from each of the pair of photoelectric conversion elements;
a pair of transfer transistors configured to transfer the electric charge from the pair of photoelectric conversion elements to the floating diffusion layer;
a reset transistor configured to initialize an amount of the electric charge in the floating diffusion layer;
a reset drain drive wiring;
a processing unit configured to synthesize the pair of pixel signals; and
a control unit configured to:
control a drain potential of the reset transistor via the reset drain drive wiring,
wherein the reset drain drive wiring connects a drain of the reset transistor and the control unit; and
control, based on the control of the drain potential of the reset transistor, back gate voltages to have one of first values in a case of the synthesis of the pair of pixel signals, or
second values different from the first values in a case of detection of a phase difference of the pair of pupil-split light rays from the pair of pixel signals,
wherein the back gate voltages include back gate potentials of the pair of transfer transistors with respect to a potential barrier between the pair of photoelectric conversion elements.

7. A method for controlling a solid-state imaging element, the method comprising:
transferring, by a pair of transfer transistors, electric charge from a pair of photoelectric conversion elements that receives a pair of pupil-split light rays to a floating diffusion layer that generates a pair of pixel signals from the electric charge transferred from the pair of photoelectric conversion elements;
initializing, by a reset transistor, an amount of the electric charge in the floating diffusion layer;
controlling, by a control unit, a drain potential of the reset transistor via a reset drain drive wiring,
wherein the reset drain drive wiring connects a drain of the reset transistor and the control unit; and controlling, by the control unit, based on the control of the drain potential of the reset transistor, back gate voltages to have one of
first values in a case of synthesizing the pair of pixel signals, or
second values different from the first values in a case of detecting a phase difference of the pair of pupil-split light rays from the pair of pixel signals,
wherein the back gate voltages include back gate potentials of the pair of transfer transistors with respect to a potential barrier between the pair of photoelectric conversion elements.

* * * * *